US011011388B2

(12) United States Patent
Eason et al.

(10) Patent No.: US 11,011,388 B2
(45) Date of Patent: May 18, 2021

(54) PLASMA APPARATUS FOR HIGH ASPECT RATIO SELECTIVE LATERAL ETCH USING CYCLIC PASSIVATION AND ETCHING

(71) Applicant: Lam Research Corporation, Fremont, CA (US)

(72) Inventors: Kwame Eason, East Palo Alto, CA (US); Pilyeon Park, Santa Clara, CA (US); Mark Naoshi Kawaguchi, San Carlos, CA (US); Seung-Ho Park, San Jose, CA (US); Hsiao-Wei Chang, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 259 days.

(21) Appl. No.: 16/296,057

(22) Filed: Mar. 7, 2019

(65) Prior Publication Data

US 2019/0206697 A1 Jul. 4, 2019

Related U.S. Application Data

(62) Division of application No. 15/667,551, filed on Aug. 2, 2017, now Pat. No. 10,276,398.

(51) Int. Cl.
*H01L 21/67* (2006.01)
*H01J 37/32* (2006.01)
(Continued)

(52) U.S. Cl.
CPC ...... *H01L 21/32136* (2013.01); *C23C 16/505* (2013.01); *C23C 16/52* (2013.01);
(Continued)

(58) Field of Classification Search
CPC ......... H01L 21/32136; H01L 27/11582; H01L 27/11556; H01L 21/31116;
(Continued)

(56) References Cited

U.S. PATENT DOCUMENTS 4,894,696 A 1/1990 Takeda
5,514,246 A * 5/1996 Blalock ............. H01J 37/32082
438/694

(Continued)

FOREIGN PATENT DOCUMENTS

JP 2013-021192 A 1/2013
JP 2013-229351 A 11/2013
(Continued)

OTHER PUBLICATIONS

US Office Action, dated Nov. 19, 2015, issued in U.S. Appl. No. 14/560,414.
(Continued)

*Primary Examiner* — Rakesh K Dhingra
*Assistant Examiner* — Laureen Chan
(74) *Attorney, Agent, or Firm* — Weaver Austin Villeneuve & Sampson LLP

(57) ABSTRACT

Methods and apparatus for laterally etching unwanted material from the sidewalls of a recessed feature are described herein. In various embodiments, the method involves etching a portion of the sidewalls, depositing a protective film over a portion of the sidewalls, and cycling the etching and deposition operations until the unwanted material is removed from the entire depth of the recessed feature. Each etching and deposition operation may target a particular depth along the sidewalls of the feature. In some cases, the unwanted material is removed from the bottom of the feature up, and in other cases the unwanted material is removed from the top of the feature down. Some combination of these may also be used.

18 Claims, 12 Drawing Sheets

(51) Int. Cl.
*C23C 16/505* (2006.01)
*C23C 16/52* (2006.01)
*H01L 21/3213* (2006.01)
*H01L 21/311* (2006.01)
*H01L 27/11582* (2017.01)
*H01L 27/11556* (2017.01)

(52) U.S. Cl.
CPC ...... *H01J 37/321* (2013.01); *H01J 37/32082* (2013.01); *H01J 37/32091* (2013.01); *H01J 37/32357* (2013.01); *H01L 21/31116* (2013.01); *H01L 21/32137* (2013.01); *H01L 21/67069* (2013.01); *H01L 27/11556* (2013.01); *H01L 27/11582* (2013.01)

(58) Field of Classification Search
CPC .......... H01L 21/32137; H01L 21/67069; H01J 37/32082; H01J 37/32357; H01J 37/32091; H01J 37/321; H01J 37/3244; H01J 37/32449; C23C 16/52; C23C 16/505
See application file for complete search history.

(56) References Cited

U.S. PATENT DOCUMENTS

| | | | |
|---|---|---|---|
| 5,767,018 A | 6/1998 | Bell | |
| 5,948,704 A | 9/1999 | Benjamin et al. | |
| 6,063,710 A | 5/2000 | Kadomura et al. | |
| 6,176,667 B1 | 1/2001 | Fairbairn et al. | |
| 6,547,977 B1 | 4/2003 | Yan et al. | |
| 6,841,943 B2 | 1/2005 | Vahedi et al. | |
| 6,916,746 B1 | 7/2005 | Hudson et al. | |
| 7,105,390 B2 | 9/2006 | Brask et al. | |
| 7,138,677 B2 * | 11/2006 | Gutsche ............ | H01L 29/66181 257/305 |
| 7,294,580 B2 | 11/2007 | Yun et al. | |
| 7,732,728 B2 | 6/2010 | Dhindsa et al. | |
| 7,740,736 B2 | 6/2010 | Fischer et al. | |
| 7,951,683 B1 | 5/2011 | Shanker | |
| 7,977,390 B2 | 7/2011 | Ji et al. | |
| 8,552,334 B2 | 10/2013 | Tappan et al. | |
| 9,378,971 B1 | 6/2016 | Briggs et al. | |
| 9,384,998 B2 | 7/2016 | Hudson et al. | |
| 9,385,318 B1 | 7/2016 | Henri | |
| 9,543,148 B1 | 1/2017 | Hudson et al. | |
| 9,543,158 B2 | 1/2017 | Hudson et al. | |
| 9,548,188 B2 | 1/2017 | Hausmann | |
| 9,576,811 B2 | 2/2017 | Kanarik et al. | |
| 9,620,377 B2 | 4/2017 | Hudson et al. | |
| 9,805,941 B2 | 10/2017 | Kanarik et al. | |
| 9,806,252 B2 | 10/2017 | Tan et al. | |
| 9,887,097 B2 | 2/2018 | Hudson | |
| 9,997,371 B1 | 6/2018 | Agarwal et al. | |
| 9,997,372 B2 | 6/2018 | Briggs et al. | |
| 9,997,373 B2 | 6/2018 | Hudson | |
| 10,170,323 B2 | 1/2019 | Hudson et al. | |
| 10,170,324 B2 | 1/2019 | Dole et al. | |
| 10,297,459 B2 | 5/2019 | Hudson et al. | |
| 10,304,693 B2 | 5/2019 | Hudson | |
| 10,373,840 B2 | 8/2019 | Hudson et al. | |
| 10,431,458 B2 | 10/2019 | Hudson et al. | |
| 10,658,174 B2 | 5/2020 | Zhou et al. | |
| 10,847,374 B2 | 11/2020 | Belau et al. | |
| 2002/0173160 A1 | 11/2002 | Keil et al. | |
| 2003/0003755 A1 | 1/2003 | Donohoe | |
| 2003/0139005 A1 | 7/2003 | Song et al. | |
| 2004/0077178 A1 | 4/2004 | Yang et al. | |
| 2004/0084410 A1 | 5/2004 | Lenz | |
| 2004/0224520 A1 | 11/2004 | Yun et al. | |
| 2005/0032388 A1 | 2/2005 | Donohoe | |
| 2005/0048785 A1 | 3/2005 | Kang et al. | |
| 2005/0136682 A1 | 6/2005 | Hudson et al. | |
| 2005/0218114 A1 | 10/2005 | Yue et al. | |
| 2006/0121721 A1 | 6/2006 | Lee et al. | |
| 2006/0226120 A1 | 10/2006 | Rusu et al. | |
| 2007/0026677 A1 | 2/2007 | Ji et al. | |
| 2007/0049018 A1 | 3/2007 | Sandhu et al. | |
| 2007/0196980 A1 | 8/2007 | Subramanian | |
| 2008/0286978 A1 | 11/2008 | Chen et al. | |
| 2009/0163035 A1 | 6/2009 | Romano et al. | |
| 2009/0197420 A1 | 8/2009 | Luong et al. | |
| 2009/0203218 A1 | 8/2009 | Matsuyama et al. | |
| 2009/0275202 A1 | 11/2009 | Tanaka et al. | |
| 2010/0009543 A1 | 1/2010 | Cho | |
| 2010/0173494 A1 | 7/2010 | Kobrin | |
| 2010/0178770 A1 | 7/2010 | Zin | |
| 2010/0323525 A1 | 12/2010 | Chi et al. | |
| 2011/0089469 A1 | 4/2011 | Merckling | |
| 2011/0201208 A1 | 8/2011 | Kawakami et al. | |
| 2013/0316518 A1 | 11/2013 | Hollister et al. | |
| 2014/0038412 A1 | 2/2014 | Hu et al. | |
| 2014/0043216 A1 | 2/2014 | Tang | |
| 2014/0065838 A1 | 3/2014 | Ellinger et al. | |
| 2014/0083978 A1 | 3/2014 | Mahadeswaraswamy et al. | |
| 2014/0144876 A1 | 5/2014 | Nakagawa et al. | |
| 2015/0083582 A1 | 3/2015 | Dhindsa et al. | |
| 2016/0163556 A1 | 6/2016 | Briggs et al. | |
| 2016/0163557 A1 | 6/2016 | Hudson et al. | |
| 2016/0163558 A1 | 6/2016 | Hudson et al. | |
| 2016/0163561 A1 | 6/2016 | Hudson et al. | |
| 2016/0181117 A1 | 6/2016 | Arghavani et al. | |
| 2016/0218015 A1 | 7/2016 | Oomori et al. | |
| 2016/0260617 A1 | 9/2016 | Hudson et al. | |
| 2016/0260620 A1 | 9/2016 | Briggs et al. | |
| 2016/0268141 A1 | 9/2016 | Hudson | |
| 2016/0343580 A1 | 11/2016 | Hudson | |
| 2016/0351407 A1 | 12/2016 | Sawataishi et al. | |
| 2016/0379824 A1 | 12/2016 | Wise et al. | |
| 2016/0379856 A1 | 12/2016 | Tomura et al. | |
| 2017/0033119 A1 | 2/2017 | Park et al. | |
| 2017/0069511 A1 * | 3/2017 | Yang ................ | H01J 37/32357 |
| 2017/0076945 A1 | 3/2017 | Hudson et al. | |
| 2017/0076955 A1 | 3/2017 | Hudson et al. | |
| 2017/0170026 A1 | 6/2017 | Hudson et al. | |
| 2017/0178920 A1 | 6/2017 | Dole et al. | |
| 2018/0174858 A1 | 6/2018 | Hudson | |
| 2018/0286707 A1 | 10/2018 | Hudson et al. | |
| 2019/0043732 A1 | 2/2019 | Eason et al. | |
| 2019/0131135 A1 | 5/2019 | Belau et al. | |
| 2020/0243326 A1 | 7/2020 | Zhou et al. | |

FOREIGN PATENT DOCUMENTS

| | | |
|---|---|---|
| JP | 2011-086966 | 8/2014 |
| KR | 10-2006-0030717 | 4/2006 |
| KR | 10-2007-0047015 | 5/2007 |

OTHER PUBLICATIONS

US Notice of Allowance, dated Apr. 6, 2016, issued in U.S. Appl. No. 14/560,414.

US Office Action, dated May 11, 2017, issued in U.S. Appl. No. 15/157,303.

US Final Office Action, dated Sep. 28, 2017, issued in U.S. Appl. No. 15/157,303.

US Notice of Allowance dated Feb. 13, 2018, issued in U.S. Appl. No. 15/157,303.

US Office Action, dated Sep. 8, 2015, issued in U.S. Appl. No. 14/724,574.

US Final Office Action, dated Dec. 18, 2015, issued in U.S. Appl. No. 14/724,574.

US Notice of Allowance, dated Mar. 1, 2016, issued in U.S. Appl. No. 14/724,574.

US Office Action dated Jul. 27, 2018, issued in U.S. Appl. No. 15/157,322.

US Final Office Action dated Feb. 7, 2019, issued in U.S. Appl. No. 15/157,322.

US Office Action, dated Jul. 11, 2016, issued in U.S. Appl. No. 14/697,521.

(56) References Cited

OTHER PUBLICATIONS

US Notice of Allowance, dated Nov. 14, 2016, issued in U.S. Appl. No. 14/697,521.
US Office Action, dated Sep. 18, 2018, issued in U.S. Appl. No. 15/364,101.
US Notice of Allowance dated Jan. 23, 2019, issued in U.S. Appl. No. 15/364,101.
US Office Action, dated Jul. 26, 2016, issued in U.S. Appl. No. 14/803,578.
US Notice of Allowance, dated Dec. 5, 2016, issued in U.S. Appl. No. 14/803,578.
US Office Action dated Apr. 3, 2018 issued in U.S. Appl. No. 15/440,842.
US Notice of Allowance dated Sep. 4, 2018 issued in U.S. Appl. No. 15/440,842.
US Office Action, dated Jun. 15, 2016, issued in U.S. Appl. No. 14/842,733.
US Notice of Allowance, dated Nov. 9, 2016, issued in U.S. Appl. No. 14/842,733.
US Notice of Allowance, dated Dec. 8, 2016, issued in U.S. Appl. No. 14/842,733.
US Office Action, dated May 12, 2017, issued in U.S. Appl. No. 15/163,123.
US Notice of Allowance, dated Sep. 26, 2017, issued in U.S. Appl. No. 15/163,123.
US Office Action, dated Oct. 17, 2018, issued in U.S. Appl. No. 15/846,018.
US Office Action, dated Aug. 4, 2017, issued in U.S. Appl. No. 15/225,489.
US Final Office Action, dated Dec. 21, 2017, issued in U.S. Appl. No. 15/225,489.
US Notice of Allowance, dated Feb. 9, 2018, issued in U.S. Appl. No. 15/225,489.
US Office Action, dated May 15, 2018, issued in U.S. Appl. No. 15/449,799.
US Notice of Allowance, dated Sep. 26, 2018, issued in U.S. Appl. No. 15/449,799.
US Office Action, dated Feb. 5, 2018, issued in U.S. Appl. No. 15/475,021.
US Final Office Action, dated Aug. 7, 2018, issued in U.S. Appl. No. 15/475,021.
US Office Action dated Jun. 7, 2018, issued in U.S. Appl. No. 15/667,551.
US Notice of Allowance dated Dec. 14, 2018, issued in U.S. Appl. No. 15/667,551.
PCT International Search Report and Written Opinion dated Nov. 9, 2017 issued in PCT/US2017/044986.
International Search Report and Written Opinion dated Jun. 29, 2018 issued in PCT/US2018/022239.
International Search Report and Written Opinion dated Nov. 9, 2018 issued in PC/US2018/043967.
Engelhardt et al. (1988) "Deep Trench Etching Using $CBrF_3$ and $CBrF_3$/Chlorine Gas Mixtures," Siemens AG, Otto-Hahn-Ring, 8000 Munich 83, Germany, pp. 48-54.
Hanson et al. (2003) "Bonding Self-Assembled, Compact Organophosphonate Monolayers to the Native Oxide Surface of Silicon," *J. Am. Chem. Soc.*, 125(51):16074-16080.
Jung et al. (2005) "Vapor-Phase Self-Assembled Monolayer for Improved Mold Release in Nanoimprint Lithography," *Langmuir*, 21(4):1158-1161.
Matsuo (May 1, 1980) "Selective etching of Si relative to $SiO_2$ without undercutting by $CBrF_3$ plasma," *Applied Physics Letters*, 36(9):768-770.

Ohiwa et al. (1990) "SiO2 Tapered Etching Employing Magnetron Discharge," *1990 Dry Process Symposium*, ULSI Research Center, Toshiba Corp., V-3, pp. 105-109.
Ohiwa et al. (Feb. 1992) "SiO2 Tapered Etching Employing Magnetron Discharge of Fluorocarbon Gas," *Jpn. J. Appl. Phys.*, 31(Part 1, 2A):405-410.
Yang et al. (2006) "CVD Growth Kinetics of $HfB_2$ Thin Films from the Single-Source Precursor $Hf(BH_4)4$," *Chem. Mater.*, American Chemical Society, 18(21):5088-5096.
Yanguas-Gil et al. (Sep./Oct. 2009) "Highly conformal film growth by chemical vapor deposition. II. Conformality enhancement through growth inhibition," *Journal of Vacuum Science & Technology A*, 27(5): 1244-1248.
Zhou, Han and Bent, Stacey F. (Jul./Aug. 2013) "Fabrication of organic interfacial layers by molecular layer deposition: Present status and future opportunities," *Journal of Vacuum Science Technology A*, American Vacuum Society, 31(4), 040801-1-040801-18.
Zhuang et al. (2006) "Thermal stability of vapor phase deposited self-assembled monolayers for MEMS anti-stiction," *J. Micromech. Microeng.*, 16:2259-2264.
U.S. Appl. No. 15/798,831, filed Oct. 31, 2017, Belau et al.
U.S. Appl. No. 15/820,110, filed Nov. 21, 2017, Zhou et al.
US Final Office Action dated Feb. 8, 2019 issued in U.S. Appl. No. 15/798,831.
US Notice of Allowance dated Apr. 15, 2019, issued in U.S. Appl. No. 15/157,322.
US Office Action, dated Apr. 1, 2019, issued in U.S. Appl. No. 15/359,362.
US Notice of Allowance, dated Jun. 13, 2019, issued in U.S. Appl. No. 15/359,362.
US Notice of Allowance dated Mar. 7, 2019, issued in U.S. Appl. No. 15/846,018.
US Office Action dated Sep. 9, 2019, issued in U.S. Appl. No. 15/820,110.
US Notice of Allowance dated Jan. 16, 2020 issued in U.S. Appl. No. 15/820,110.
US Final Office Action dated Jan. 3, 2020 issued in U.S. Appl. No. 15/798,831.
US Office Advisory Action dated Mar. 3, 2020 issued in U.S. Appl. No. 15/798,831.
US Notice of Allowance dated Aug. 5, 2020 issued in U.S. Appl. No. 15/798,831.
US Notice of Allowance dated Mar. 26, 2019, issued in U.S. Appl. No. 15/903,865.
Taiwanese First Office dated Apr. 17, 2019 issued in TW 104139822.
Taiwanese Decision of Refusal dated Aug. 19, 2019 issued in TW 104139822.
Taiwanese First Office Action dated May 13, 2019 issued in TW 104139815.
International Preliminary Report on Patentability dated Feb. 14, 2019 issued in PCT/US2017/044986.
International Preliminary Report on Patentability dated Oct. 10, 2019 issued in PCT/US2018/022239.
International Preliminary Report on Patentability dated Feb. 13, 2020 issued in PC/US2018/043967.
International Search Report and Written Opinion dated Mar. 5, 2019 issued in PCT/US2018/060743.
McVittie, J. (2007) "Tutorial on Using RF to Control DC Bias" (2007) found in Web-page "https://nccavs-usergroups.avs.org/wp-content/uploads/PAG2007/PEUG_07_5_McVittie.pdf" Used Only as Evidence.

\* cited by examiner

PLASMA APPARATUS FOR HIGH ASPECT RATIO SELECTIVE LATERAL ETCH USING CYCLIC PASSIVATION AND ETCHING

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

In various semiconductor processing schemes, high aspect ratio features are etched into stacks of material. Example applications include, but are not limited to, memory applications such as fabrication of DRAM and 3D NAND devices. Often, the stacks include dielectric material, and may include alternating layers of materials such as oxide and nitride or oxide and polysilicon. After the high aspect ratio features are etched (e.g., to form recessed cylinders, trenches, etc.), a selective etch process occurs to etch back one of the materials in the stack. In some cases, a liner material may be deposited after this selective etch. Material (e.g., metal, polysilicon, or dielectric in many cases) is then deposited along the sidewalls of the feature, including within the areas that were selectively etched back. This material must then be removed in order to electrically isolate the material deposited in each region that was previously selectively etched back. This process scheme is further discussed below with reference to FIGS. 1A-1E.

SUMMARY

Various embodiments herein relate to methods, apparatus, and systems for etching unwanted material from a semiconductor substrate. In many cases, the unwanted material is laterally etched from a sidewall of a recessed feature on the semiconductor substrate. The etching may occur in stages, cycled with a deposition operation that deposits a protective film over a portion of the sidewall. This protective film protects the covered portion of the sidewall from over-etching and promotes delivery of etching reactants further down into the feature during a later etching operation. In some embodiments, the unwanted material is removed from the feature from the top of the sidewall to the bottom of the sidewall. In other embodiments, this order is reversed and the unwanted material is removed from the feature from the bottom of the sidewall to the top of the sidewall.

In one aspect of the disclosed embodiments, a method of laterally etching unwanted material from a sidewall of a feature on a substrate, the method including: (a) performing an etching operation by exposing the substrate to an etching plasma, the etching plasma including a remotely generated inductively coupled plasma including an etching reactant, where the etching operation laterally etches the unwanted material from a portion of the sidewall of the feature; (b) performing a deposition operation by exposing the substrate to a deposition plasma, the deposition plasma including a capacitively coupled plasma including a deposition reactant, where the deposition operation forms a protective film over a second portion of the sidewall of the feature, where the protective film is non-conformal such that it is thickest near a top of the sidewall and does not extend all the way to a bottom of the sidewall; and (c) cycling the etching operation of (a) and the deposition operation of (b) until the unwanted material is laterally etched along the entire sidewall of the feature, where different iterations of (a) laterally etch the unwanted material from different portions of the sidewall of the feature, where different iterations of (b) deposit the protective film over different second portions of the sidewall of the feature, and where during at least one iteration of the etching operation in (a), the portion of the sidewall that is laterally etched is directly below the second portion of the sidewall that is covered by the protective film deposited in a previous iteration of (b).

In some embodiments, a first iteration of the etching operation in (a) is performed before a first iteration of the deposition operation in (b) such that the first iteration of (a) is performed without the protective film on the sidewall, and the portion of the sidewall that is laterally etched in the first iteration of (a) is a top portion of the sidewall. In some such cases, the first iteration of the deposition operation in (b) forms the protective film on the same portion of the sidewall that was laterally etched in the first iteration of the etching operation in (a). A second iteration of the etching operation in (a) may be performed after the first iteration of the deposition operation in (b), and the portion of the sidewall that is laterally etched in the second iteration of (a) may be deeper in the feature compared to the portion of the sidewall that is laterally etched in the first iteration of (a). In these or other cases, the second portion of the sidewall over which the protective film forms in each iteration of the deposition operation in (b) may include the portion of the sidewall at which the unwanted material is removed in an immediately previous iteration of the etching operation in (a), such that the protective film always forms in (b) to cover the portion of the sidewall that was just etched in a previous iteration of (a).

In certain implementations, the unwanted material is removed from the top of the sidewall to the bottom of the sidewall, in that order, as additional iterations of (a) and (b) are performed. In a number of embodiments, the protective film is formed such that it reaches increasingly greater depths along the sidewall as additional iterations of (b) are performed. In some such cases, the protective film is formed using different sets of deposition conditions in different iterations of (b). In one example, the different sets of deposition conditions in the different iterations of (b) vary from one another with respect to at least one variable selected from the group consisting of: substrate support temperature, pressure, flow rate of the deposition reactant, and RF power used to generate the capacitively coupled plasma.

In another embodiment, a first iteration of the deposition operation in (b) is performed before a first iteration of the etching operation in (a) such that the first iteration of (a) is performed while the protective film is present on the sidewall. In some implementations, the unwanted material is removed from the bottom of the sidewall to the top of the sidewall, in that order, as additional iterations of (a) and (b) are performed. In these or other implementations, the protective film may be formed such that it reaches increasingly shallow depths along the sidewall as additional iterations of (b) are performed. In some cases, the method further includes stripping the protective film from the sidewall after each iteration of the etching operation in (a), and prior to depositing the protective film in a subsequent iteration of the deposition operation in (b), where stripping the protective film includes exposing the substrate to a stripping plasma including oxygen.

In certain embodiments, the protective film is a hydrofluorocarbon-based polymeric film. In some other cases, the protective film is silicon, silicon oxide, or silicon nitride. The etching reactant may produce fluorine radicals in various cases. In certain implementations, the unwanted material includes a metal. The metal may be an elemental metal. In some cases the elemental metal is tungsten. In some other implementations, the unwanted material is polysilicon. In some other implementations, the unwanted material is silicon nitride.

In some cases, (a) and (b) occur in the same reaction chamber, where the reaction chamber includes: a lower chamber region and an upper chamber region separated by a gas distribution device, an inductively coupled plasma source that generates the inductively coupled plasma in the upper chamber region, and a capacitively coupled plasma source that generates the capacitively coupled plasma in the lower chamber region. In some other cases, (a) and (b) occur in different reaction chambers, the method further including transferring the substrate between the different reactors as needed to perform (a) and (b).

In certain implementations, the feature is formed in a stack including alternating layers of a first stack material and a second stack material, where the etching operation in (a) exposes at least one of the first stack material and the second stack material, and where the etching operation in (a) is selective such that the unwanted material is preferentially removed compared to the first stack material and the second stack material.

In another aspect of the embodiments herein, an apparatus for laterally etching unwanted material from a sidewall of feature on a substrate is provided, the apparatus including: a reaction chamber including a lower chamber region and an upper chamber region; a gas distribution device separating the lower chamber region from the upper chamber region; an inductively coupled plasma source that generates an inductively coupled plasma in the upper chamber region; a capacitively coupled plasma source that generates a capacitively coupled plasma in the lower chamber region; a first inlet for delivering gas phase reactants to the upper chamber region; a second inlet for delivering gas phase reactants to the lower chamber region; an outlet for removing gas phase material from the lower chamber region; and a controller that: (a) performs an etching operation by generating an inductively coupled etching plasma including an etching reactant in the upper chamber region while the substrate is positioned in the lower chamber region, where the etching operation laterally etches the unwanted material from a portion of the sidewall of the feature; (b) performs a deposition operation by generating a capacitively coupled deposition plasma including a deposition reactant in the lower chamber region while the substrate is positioned in the lower chamber region, where the deposition operation forms a protective film over a second portion of the sidewall of the feature, where the protective film is non-conformal such that it is thickest near a top of the sidewall and does not extend all the way to a bottom of the sidewall; and (c) cycles the etching operation of (a) and the deposition operation of (b) until the unwanted material is laterally etched along the entire sidewall of the feature, where different iterations of (a) laterally etch the unwanted material from different portions of the sidewall of the feature, where different iterations of (b) deposit the protective film over different second portions of the sidewall of the feature, and where during at least one iteration of the etching operation in (a), the portion of the sidewall that is laterally etched is directly below the second portion of the sidewall that is covered by the protective film deposited in a previous iteration of (b).

These and other features will be described below with reference to the associated drawings.

DETAILED DESCRIPTION

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the embodiments are implemented on a wafer. However, the embodiments are not so limited. The work piece may be of various shapes, sizes, and materials. In addition to semiconductor wafers, other work pieces that may take advantage of the disclosed embodiments include various articles such as printed circuit boards, magnetic recording media, magnetic recording sensors, mirrors, optical elements, micro-mechanical devices and the like.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Figure 1A:
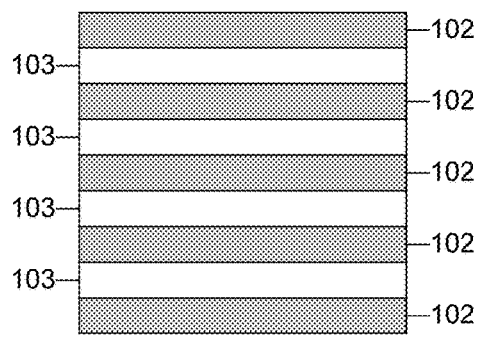
FIGS. 1A-1F illustrate a partially fabricated semiconductor substrate over the course of various processing steps.
Figure 1B:
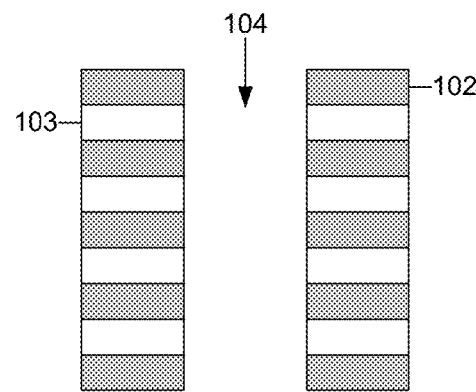

FIGS. 1A-1F depict a partially fabricated substrate at various points in time according to certain embodiments. In FIG. 1A, the substrate includes a stack having a number of alternating layers of a first material 102 and a second material 103. In one example, the first material 102 is an oxide material such as silicon oxide and the second material 103 is polysilicon, or vice versa. In another example, the first material 102 is an oxide material and the second material 103 is a nitride material (e.g., silicon nitride), or vice versa. Generally speaking, the stack may include low-k dielectric materials, silicon nitride ($Si_3N_4$), titanium nitride (TiN), and silicon oxide ($SiO_2$). After the stack is deposited, a feature 104 is etched into the stack, as shown in FIG. 1B. The feature may be a high aspect ratio feature. In various embodiments, the feature may have a depth to width aspect ratio between about 20 and 200. In some cases, the feature may have an aspect ratio of at least about 20, or at least about 40, or at least about 60, or at least about 100, or at least about 150. In these or other cases, the feature may have an aspect ratio of about 200 or less, or about 120 or less, about 100 or less, or about 80 or less. Generally, the techniques described herein enable processing over a wide range of aspect ratios. The aspect ratio is calculated as the depth of the feature divided by the critical diameter (e.g., width) of the feature. In some cases, the feature may have a depth between about 30 kA-120 kA, or between about 45 kA-60 kA. In these or other cases, the feature may have a critical diameter between about 250 A-1500 A, or between about 500 A-1000 A.

Figure 1C:
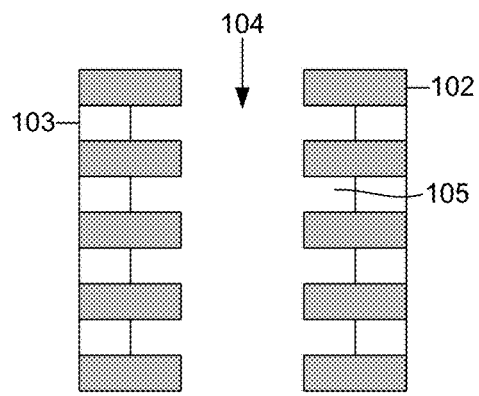
Figure 1D:
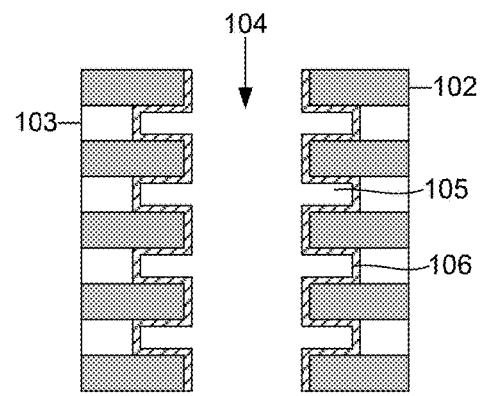
Figure 1E:
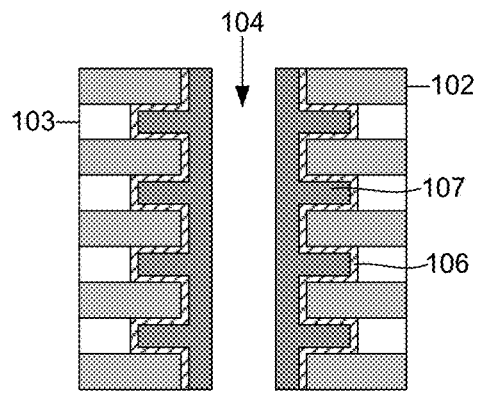
Figure 1F:
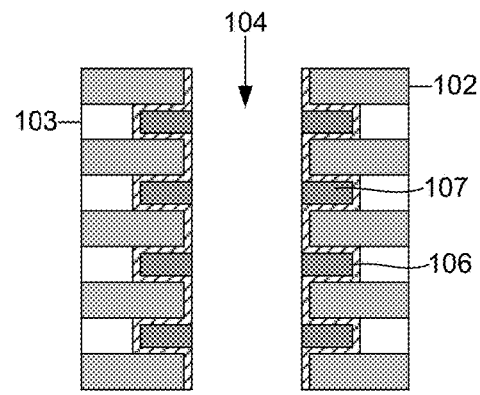

Next, as shown in FIG. 1C, a selective etch is performed to etch back the second material while substantially preserving the first material. This selective etch forms recessed pockets 105. As shown in FIG. 1D, a liner 106 (e.g., a nitride material in some cases, though other materials may also be used) may be deposited along the sidewalls of the feature 104, including lining the recessed pockets 105. In some cases the liner 106 may be omitted. Next, as shown in FIG. 1E, material 107 (e.g., metal, polysilicon, or dielectric material in certain cases) is deposited along the sidewalls of the feature 104, including within the recessed pockets 105. Next, as shown in FIG. 1F, a portion of the material 107 is removed from the sidewalls of the feature 104. This etching operation electrically isolates the different portions of the material 107 formed in each of the previously recessed pockets 105. Because this etching operation results in exposure of two or more materials along the sidewalls (e.g., material 107 and liner 106, or material 107 and first material 102), the etching should be selective. For instance, the etching operation may be optimized to etch material 107 while substantially preserving the liner 106 and/or first material 102.

In practice, it has been difficult to perform this etching operation for high aspect ratio features. For example, in cases where a wet etch is used, the etch process is very difficult to control. With increasingly narrow features and high aspect ratios, it is difficult to deliver the wet chemistry into the features (especially to the bottom of the features) to initiate the etch process, and it is also difficult to remove the wet chemistry from the features after etching is complete. These difficulties may arise due to capillary effects. In some cases, removal of the wet chemistry can lead to pattern collapse, where the sidewalls of the features collapse in on one another, effectively ruining the features. Moreover, the wet etch process is difficult to control because etching happens very quickly once the chemistry contacts the relevant portion of the substrate. These effects combine to make wet etching challenging to incorporate into various processing schemes.

Figure 1G:
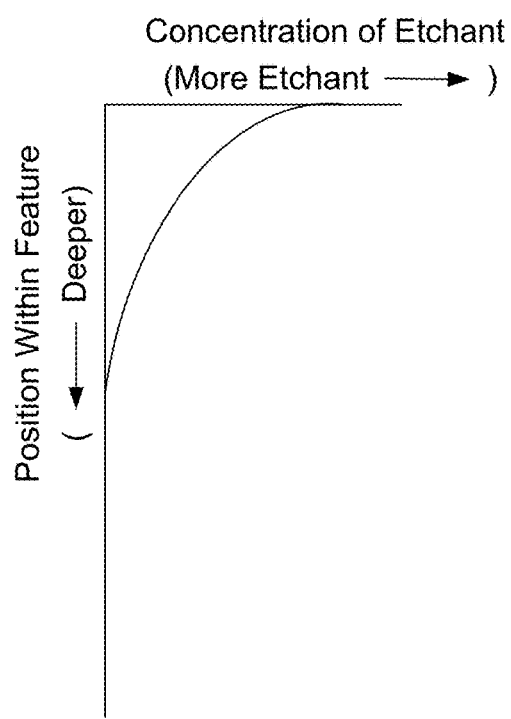
FIGS. 1G and 1H are graphs describing the concentration of etchant at different positions within a recessed feature, where FIG. 1G corresponds to a case where no protective film is provided on the sidewalls, and FIG. 1H corresponds to a case where a protective film is provided on the sidewalls.
Figure 1H:
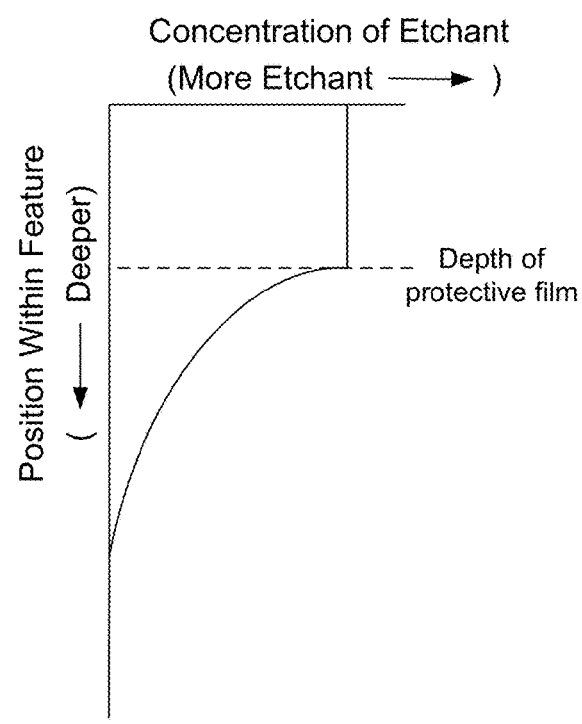

In cases where a conventional dry etch is used, it has not previously been possible to laterally etch sidewalls of high aspect ratio features in a uniform manner. For instance, as shown in FIG. 1G, the etch chemistry is substantially more concentrated/available near the top of the feature, and is substantially depleted near the bottom of the feature. This depletion results from the loss of etch species to the sidewalls near the top of the feature (e.g., through reaction, adsorption, etc.). With reference to FIGS. 1E and 1F, conventional dry etch techniques result in over-etching of material 107 near the top of the feature 104, and under-etching (in many cases no etching) of material 107 at the middle and/or bottom of the feature 104. FIG. 1H is discussed further below.

Figure 2A:
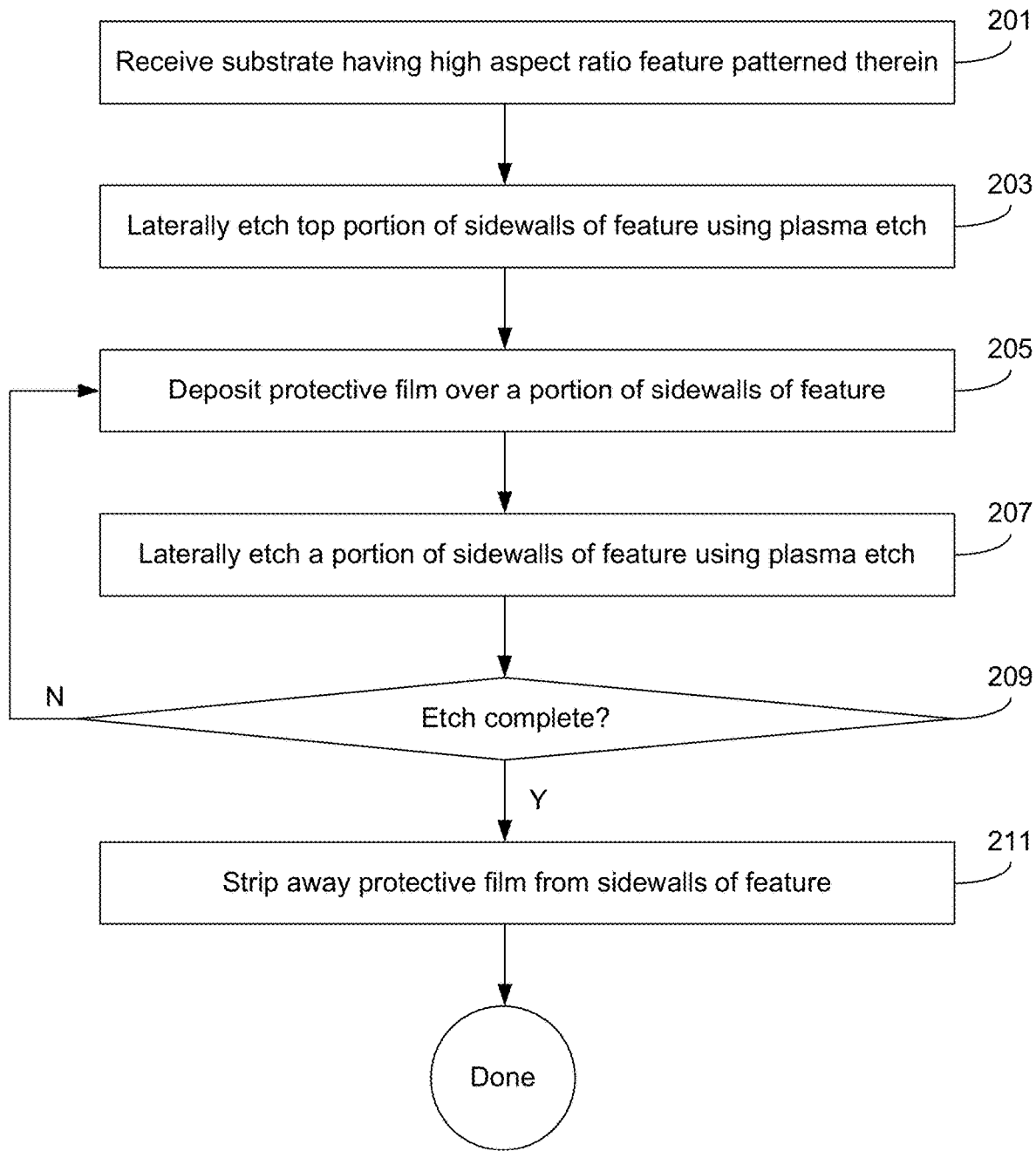
FIG. 2A is a flowchart describing a method of laterally etching a high aspect ratio feature according to certain embodiments where material is first removed from a top portion of the feature and later removed from a bottom portion of the feature.
Figure 2B:
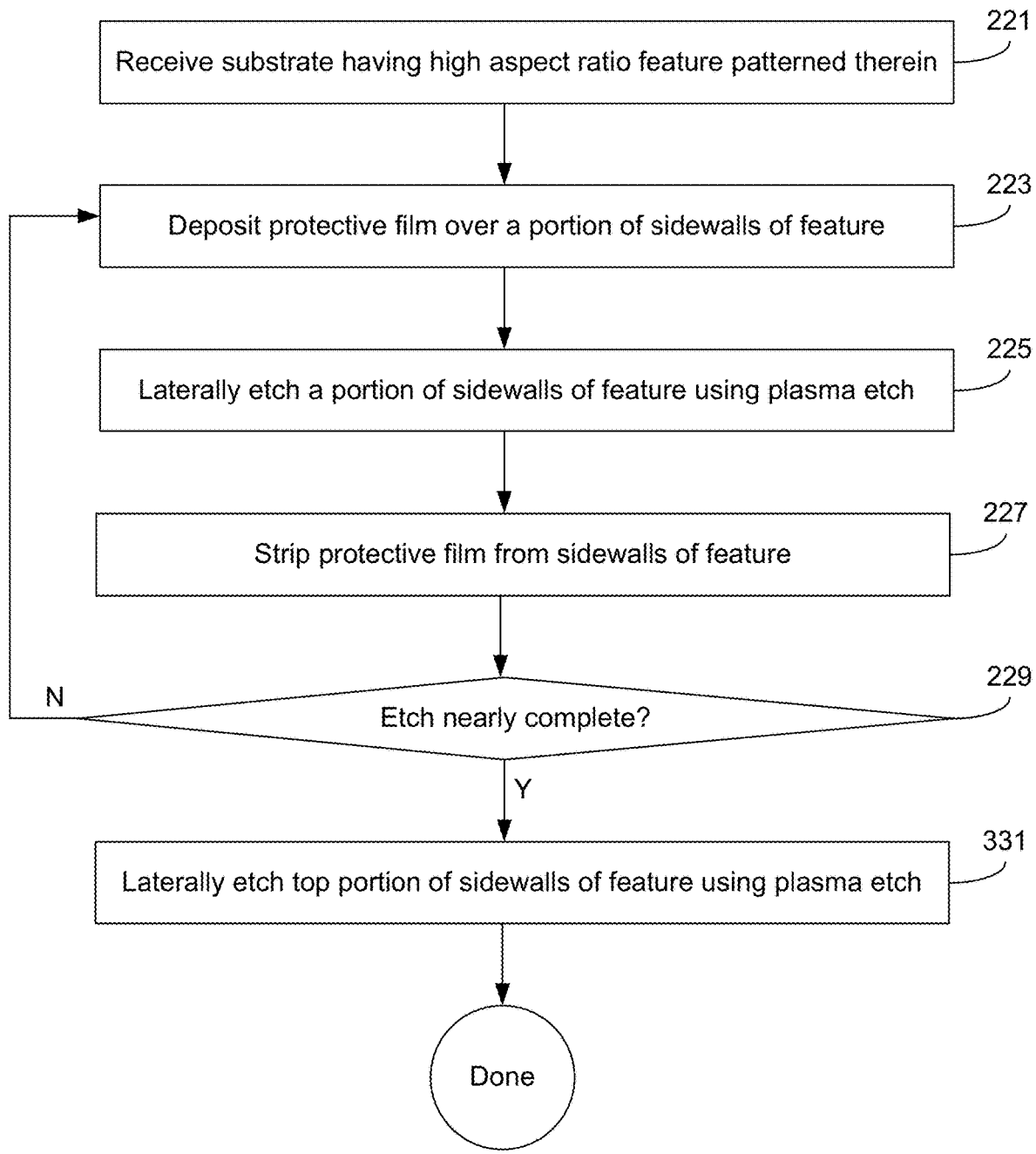
FIG. 2B is a flowchart describing a method of laterally etching a high aspect ratio feature according to certain embodiments where material is first removed from a bottom portion of the feature and later removed from a top portion of the feature.

In various embodiments herein, a high aspect ratio feature is laterally etched using a technique that involves (a) deposition of a protective film along a portion of the sidewalls, and (b) dry etching the sidewalls in an area substantially free of the protective film. These steps may be repeated any number of times, and either step may be performed first. In some cases, these steps may be cycled with a step that involves removing the protective film. In other cases, the protective film is removed after the feature is fully etched. The unwanted material on the sidewalls of the feature may be removed from the bottom of the feature up, or from the top of the feature down, with a different portion of the feature being etched in different etching operations. FIGS. 2A and 2B provide flowcharts for alternative methods of practicing the disclosed embodiments. FIG. 2A describes a process in which the unwanted sidewall material is removed from the top of the feature to the bottom of the feature, while FIG. 2B describes a process in which the unwanted sidewall material is removed from the bottom of the feature to the top of the feature. FIG. 2A is described in relation to the partially fabricated substrates shown in FIGS. 3A-3G, and FIG. 2B is described in relation to the partially fabricated substrates shown in FIGS. 4A-4H.

Figure 3A:
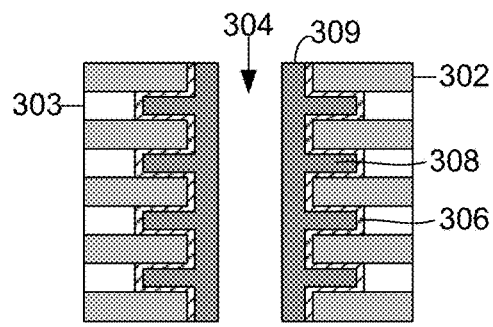
FIGS. 3A-3G illustrate a partially fabricated semiconductor substrate over the course of various processing steps described in FIG. 2A.

The method of FIG. 2A starts at operation 201, where a substrate having a high aspect ratio feature formed therein is received in a processing apparatus. In many cases, the substrate will have a plurality of features formed therein. Example aspect ratios are between about 20-200, as mentioned above. With reference to FIG. 3A, the feature 304 may be formed in alternating layers of a first material 302 and a second material 303. The first and second materials 302 and 303, respectively, may be the materials described in relation to the first and second materials 102 and 103, respectively, in FIGS. 1A-1F. Optionally, a liner 306 may be provided, as shown. Material 308 and unwanted material 309 are the same type of material, and may be a material described in relation to material 107 in FIGS. 1E and 1F. The different reference numerals 308 and 309 relate to the position of the material. Specifically, material 308 is positioned between layers of the first material 302, within recesses that were formed when the second material 303 was etched back (e.g., as described in relation to FIGS. 1C, 1E, and 1F), and unwanted material 309 is positioned along the sidewalls of the feature 304, outside of these recesses. One goal in a number of embodiments is to remove unwanted material 309 while substantially preserving material 308.

Figure 3B:
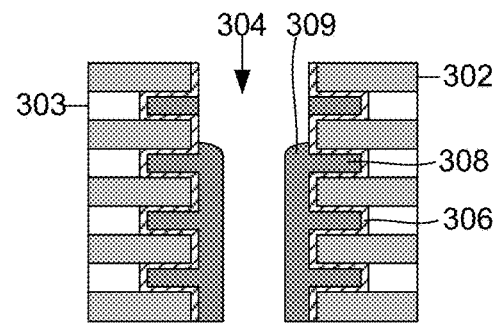

Next, at operation 203 a plasma etch is performed to laterally etch a top portion of the sidewalls of the feature 304, as shown in FIG. 3B. The etching process is further described below. The etching is limited to the top portion of the feature 304 due to the nature of the etching process. For example, as shown in FIG. 1G, the etching chemistry is concentrated near the top of the feature 304, and is substantially depleted farther down in the feature 304. Because so little etchant penetrates deep into the feature 304, the etching is limited to the top portion of the feature 304. The etching process is a selective etch, meaning that it is tailored to remove material 309 while substantially preserving the liner 306, if present, and/or the first material 302, if exposed.

Figure 3C:
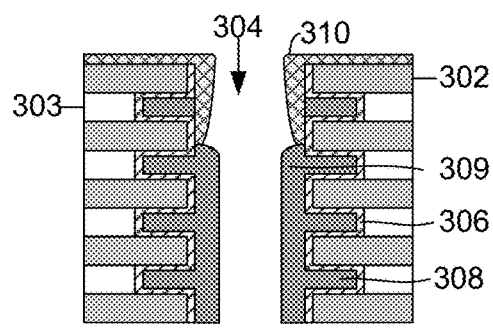

Next, at operation 205 a protective film 310 is deposited over a portion of the sidewalls of the feature 304, as shown in FIG. 3C. The deposition process is further discussed below. Generally, the protective film 310 is made of a material that resists the etch chemistry used in a subsequent etching operation, such that the protective film 310 etches much slower (or not at all) compared to unwanted material 309. In a first iteration, the protective film 310 may be formed on a top portion of the sidewalls. This may correspond to the same portion of the feature 304 where the unwanted material 309 was previously removed. By targeting the protective film 310 to form in areas where the unwanted material 309 has been removed, these areas can be protected from over-etching in future etching steps.

Figure 3D:
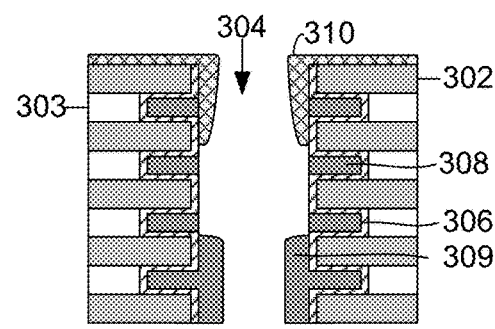

At operation 207, an additional plasma etch is performed to laterally etch a portion of the sidewalls of the feature 304, for example as shown in FIG. 3D. The portion of the sidewalls that is etched in operation 207 is the portion of the sidewalls immediately below the protective film 310. FIG. 1H illustrates the availability of etching chemistry during operation 207. Because the protective film 310 protects the sidewalls from further reaction near the top of the feature 304, the etching chemistry does not begin to deplete substantially until reaching the depth of the protective film. Below this depth, the etching chemistry reacts to remove unwanted material 309, and begins to deplete.

Next, it is determined in operation 209 whether the etching is complete. In some cases, operation 207 may remove the unwanted material 309 all the way to the bottom of the feature 304, in which case the etching is complete and the method moves on to operation 211, where the protective film 310 is stripped away from the sidewalls of the feature 304. The stripping operation is further discussed below.

Figure 3E:
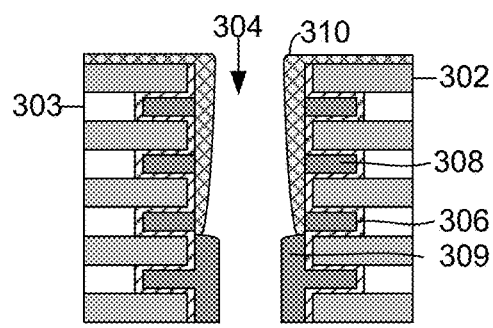

In other cases, for example as shown in FIG. 3D, operation 207 removes only a portion of the remaining unwanted material 309 from the sidewalls (e.g., below the top portion where the unwanted material 309 was previously removed, and above a bottom portion where the unwanted material 309 remains). In these cases, the method continues from operation 209 to operation 205, where an additional protective film 310 is deposited over a portion of the sidewalls, as shown in FIG. 3E. Protective film 310 may be formed directly on the protective film 310 that was previously deposited. However, in some cases the first protective film 310 of FIG. 3D may be stripped away before deposition of the additional protective film 310 of FIG. 3E. In any case, the protective film 310 deposited in the second iteration of operation 205 extends deeper into the feature 304 compared to the protective film 310 deposited in the first iteration of operation 205. Generally speaking, the protective film 310 may be deposited successively deeper into the feature 304 with each iteration when practicing the method of FIG. 2A. However, in some cases, it may be beneficial to deposit a protective film 310 that extends less deep into the feature 304 compared to a previously deposited protective film 310 (e.g., to more thoroughly etch a particular portion of the sidewalls).

Figure 3F:
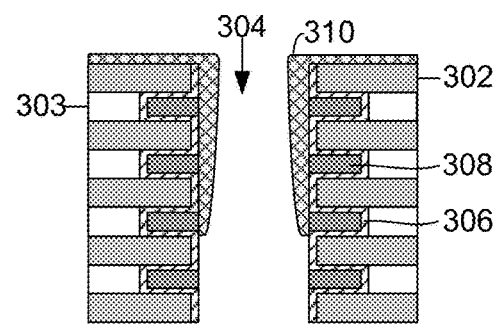
Figure 3G:
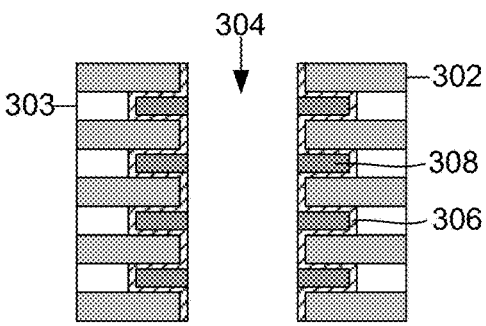

Next, at operation 207, an additional plasma etch is performed to remove the unwanted material 309 from a portion of the sidewalls, as shown in FIG. 3F. As mentioned above, the portion of the sidewalls that is etched is the portion directly below the protective film 310. With reference to FIG. 1H, the protective film now extends deeper into the feature 304 compared to the previous iteration of operation 207. As such, the etching chemistry is able to penetrate deeper into the feature to etch the relevant portion of the sidewalls. In the example of FIGS. 3A-3G, the unwanted material 309 is fully removed after the second iteration of operation 207. As such, at operation 209 it is determined that the etch is now complete, and the method continues with operation 211 where the protective film is stripped from the sidewalls of the feature, as shown in FIG. 3G.

Figure 4A:
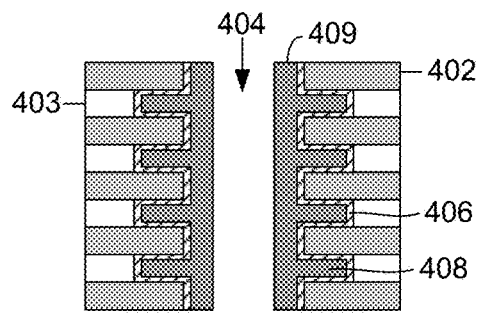
FIGS. 4A-4H illustrate a partially fabricated semiconductor substrate over the course of various processing steps described in FIG. 2B.

Another method is described in FIG. 2B, with reference to FIGS. 4A-4H. The method of FIG. 2B starts with operation 221, where a substrate having a high aspect ratio feature patterned therein is provided in a processing apparatus. As mentioned above, in many cases the substrate will have a plurality of features formed therein. With reference to FIG. 4A, the feature 404 may be formed in alternating layers of a first material 402 and a second material 403. The first and second materials 402 and 403, respectively, may be the materials described in relation to the first and second materials 102 and 103, respectively, in FIGS. 1A-1F. Optionally, a liner 406 may be provided, as shown. Material 408 and unwanted material 409 are the same type of material, and may be a material described in relation to material 107 in FIGS. 1E and 1F. The different reference numerals 408 and 409 relate to the position of the material. Specifically, material 408 is positioned between layers of the first material 402, within recesses that were formed when the second material 403 was etched back (e.g., as described in relation to FIGS. 1C, 1E, and 1F), and unwanted material 409 is positioned along the sidewalls of the feature 404, outside of these recesses. As noted above, one goal in a number of embodiments is to remove unwanted material 409 while substantially preserving material 408.

Figure 4B:
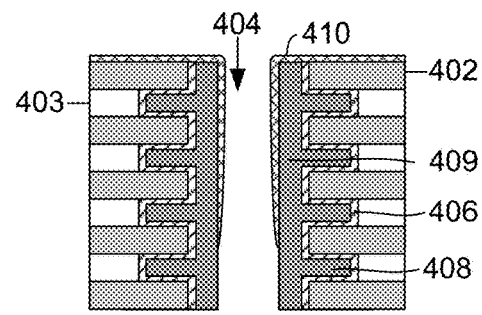
Figure 4C:
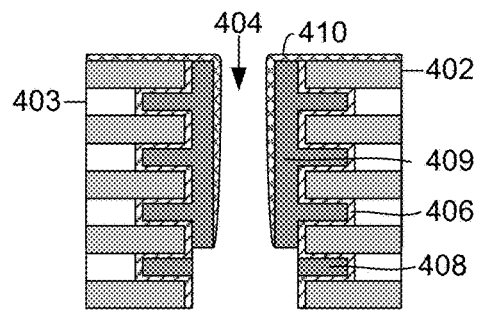
Figure 4D:
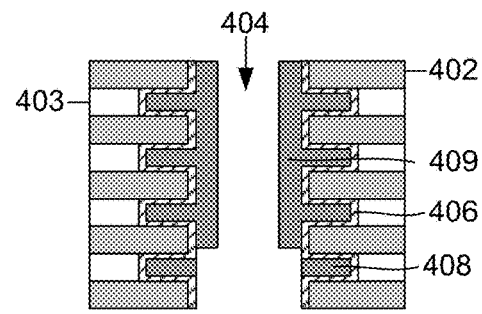

The method continues at operation 223, where a protective film 410 is deposited over a portion of the sidewalls of the feature 404, as shown in FIG. 4B. The protective film 410 is deposited to a relatively deep depth. The deposition is discussed further below. Next, at operation 225, a portion of the sidewalls of the feature 404 is laterally etched to remove unwanted material 409, as shown in FIG. 4C. The portion of the sidewalls that is laterally etched is the bottom portion, below the protective film 410. Because the protective film 410 extends deep into the feature 404, the etching chemistry is able to penetrate deep into the feature to etch the sidewalls near the feature bottom (e.g., since the etching chemistry is not being depleted through reactions with the unwanted material 409 near the top of the feature). Next, at operation 227, the protective film 410 is stripped from the sidewalls, as shown in FIG. 4D. The stripping operation is further discussed below. In some cases, this stripping operation 227 may be omitted, e.g., in cases where the etching conditions remove a substantial portion of the protective film during operation 225 such that there is no need to strip it away in a separate step.

Next, it is determined whether the etching is nearly complete. The etching is nearly complete when the remaining unwanted material 409 can be removed in a single etching operation. In cases where the etching is nearly complete, the method continues with operation 331, where a plasma etch is used to laterally etch the remaining unwanted material 409 from the top portion of the sidewalls of the feature 404. This operation will be discussed below with reference to FIGS. 4G and 4H.

Figure 4E:
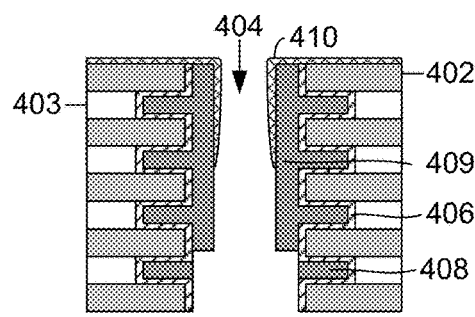

In cases where it is determined that the etching is not yet nearly complete in operation 229, the method continues with operation 223, where a new protective film 410 is deposited over a portion of the sidewalls of the feature 404, as shown in FIG. 4E. The new protective film 410 deposited in the second iteration of operation 223 may extend less deep into the feature 404 compared to the first protective film 410 deposited in the first iteration of operation 223. Generally, the protective film 410 may be formed less and less deep as additional iterations are performed. However, in some cases it may be beneficial to form a protective film 410 deeper than a previous protective film 410, for example to more extensively remove unwanted material 409 from a particular portion of the sidewalls. The method continues with a second iteration of operation 225, where a plasma etch is used to laterally etch a portion of the sidewalls of the feature. The portion that is etched is the portion directly below the protective film 410 that was deposited in operation 223. The protective film 410 should be deposited sufficiently deep in operation 223 such that during operation 225, the etching chemistry is able to penetrate into the feature to remove the remaining unwanted material 409 positioned lower than the protective film 410. If the protective film 410 is not deposited sufficiently deep, the etching chemistry may become overly depleted before it is able to penetrate deep into the feature and remove all of the remaining unprotected unwanted material 409.

Figure 4F:
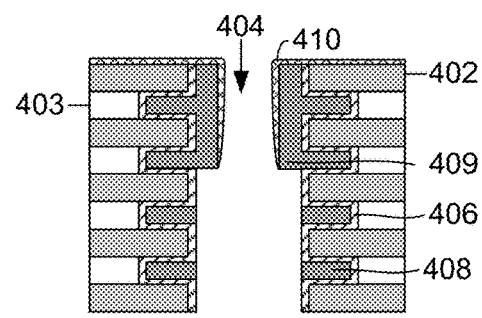
Figure 4G:
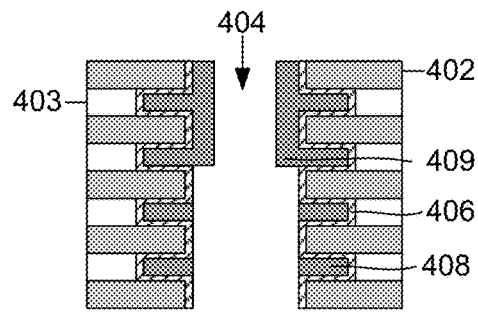
Figure 4H:
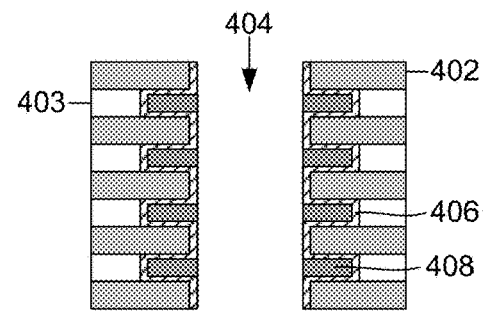

After the protective film 410 is deposited as shown in FIG. 4E, a plasma etch is performed in operation 225 to laterally etch the sidewalls to remove a portion of the unwanted material 409, as shown in FIG. 4F. The portion of the unwanted material 409 that is removed is the portion directly below the protective film 410. Next, in operation 227, the protective film 410 is stripped from the sidewalls of the feature 404, as shown in FIG. 4G. The method continues with operation 229, where it is again determined whether the etch is nearly complete. In the context of FIG. 4G, the etch is determined to be nearly complete because the remaining unwanted material 409 can be removed in a single etching operation. As such, the method continues with operation 331, where the top portion of the sidewalls are laterally etched to remove the remaining unwanted material 409, as shown in FIG. 4H. This etch is done without any protective film 410 on the sidewalls, such that the unwanted material 409 near the top of the feature 404 can be removed.

With the process schemes described in FIGS. 2A and 2B and shown in FIGS. 3A-3G and 4A-4H, the risk of over-etching any portion of the sidewalls is substantially reduced (compared to conventional wet and dry etching schemes) because for each etching operation, each portion of the sidewall is either (1) targeted for etching a particular amount, (2) protected from etching due to the presence of the protective film, or (3) protected from etching due to the lack of etchant chemistry penetration at the relevant depth of the feature. Moreover, the etching can be done at a rate that is sufficiently slow to be controllable, and sufficiently fast to provide an acceptable throughput. As such, these methods provide substantial advantages over the conventional techniques described above.

The techniques described herein are also advantageous in that they enable close control over the sidewall profile that is achieved. Because each etching operation targets a particular portion of the sidewalls, the degree of etching at each portion of the sidewall can be controlled. The degree of etching can be controlled based on the duration of the etch operation targeting each portion of the sidewall. For example, FIGS. 7A-7K depict a partially etched feature over the course of several processing steps, where each etching operation is controlled to achieve a particular degree of etching. FIGS. 7A-7K depict a processing sequence similar to that shown in FIGS. 4A-H, and may be accomplished using the method of FIG. 2B. For the sake of brevity, only the differences will be described.

In this example, feature 704 is pre-formed in alternating layers of first material 702 and second material 703. An optional liner 706 may be present, as shown. Unwanted material 709 lines the sidewalls of the feature 704. Protective film 710 is repeatedly formed and removed, as shown in the figures. In a first iteration of the etching operation (e.g., going from FIG. 7B to 7C), a relatively long etching duration is used. The result is that unwanted material 709/ material 708 near the bottom of the feature 704 are etched back to a significant degree between the layers of the first material 702. In a second iteration of the etching operation (e.g., going from FIG. 7E to 7F), the etching duration is controlled to achieve a lower degree of etching (at the relevant portion of the sidewall) compared to the first iteration. In a third iteration of the etching operation (e.g., going from FIG. 7H to 7J), the etching duration is controlled to achieve a lower degree of etching (at the relevant portion of the sidewall) compared to the second iteration. In a fourth iteration of the etching operation (e.g., going from FIG. 7K to 7L), the etching duration is controlled to achieve a lower degree of etching compared to the third iteration. In other words, the etching duration is controlled during each etching operation such that the amount of material 708 remaining is relatively low near the bottom of the feature 704 and relatively high near the top of the feature 704. In another embodiment, the method of FIG. 2A may be used to create the same resulting structure shown in FIG. 7L. While FIGS. 7A-7L depict only a single cell being targeted for etching during each etching operation (each cell being defined between two layers of first material 702), this is done for the sake of simplicity. In some embodiments, each etching operation may target a number of cells along the sidewall, depending, e.g., on the chemistry and processing conditions that are used, both during deposition of the protective film 710 and during each etching iteration.

Figure 7A:
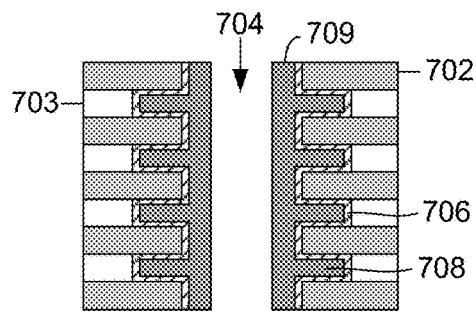
FIGS. 7A-7K depict a partially fabricated semiconductor substrate over the course of various processing steps according to an embodiment where each etching operation is controlled to achieve a particular etch amount such that the resulting sidewall is non-vertical.
Figure 7B:
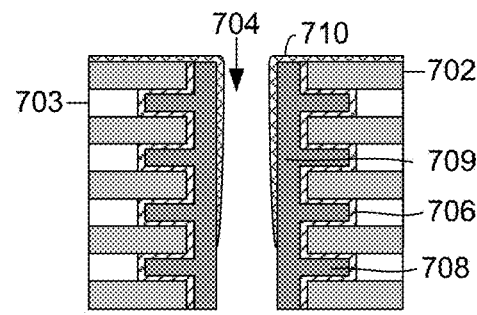
Figure 7C:
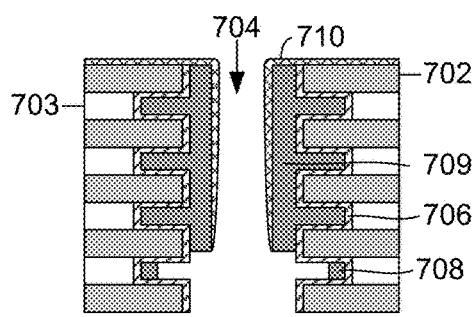
Figure 7D:
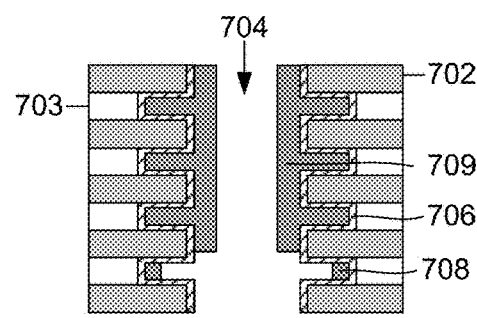
Figure 7E:
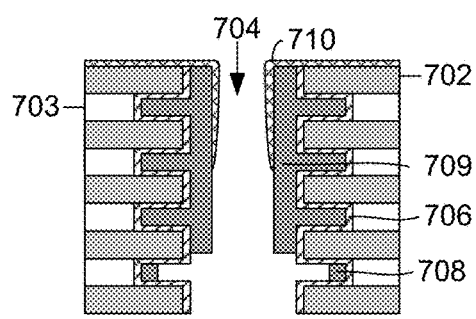
Figure 7F:
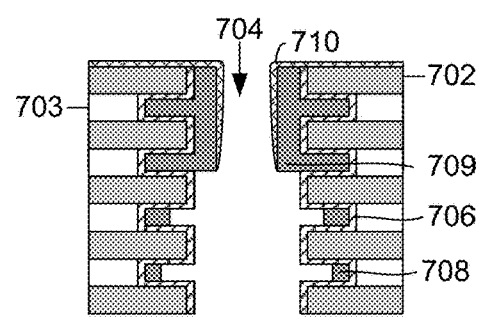
Figure 7G:
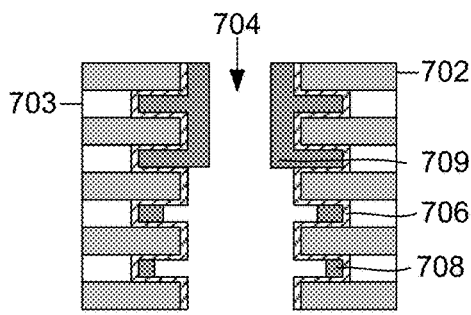
Figure 7H:
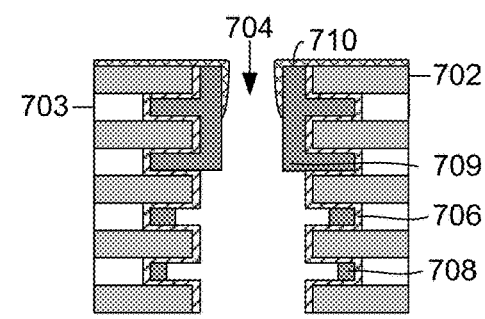
Figure 7I:
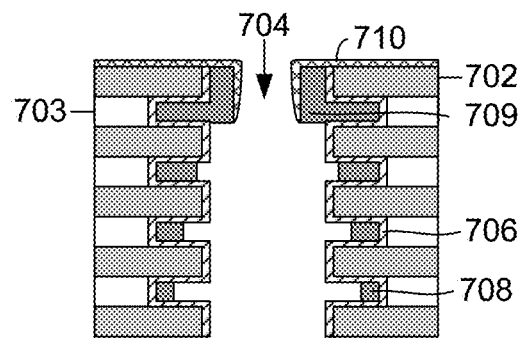
Figure 7J:
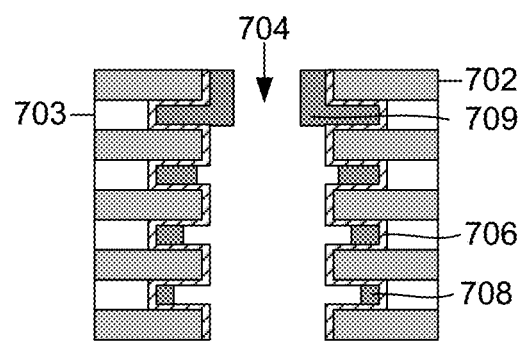
Figure 7K:
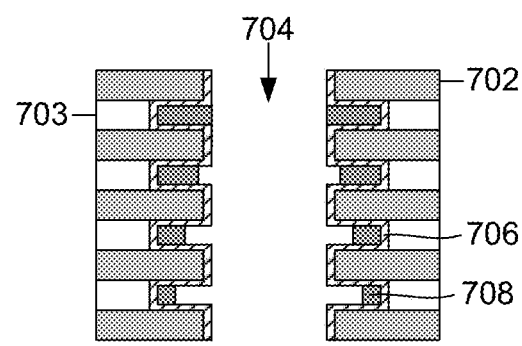
Figure 7L:
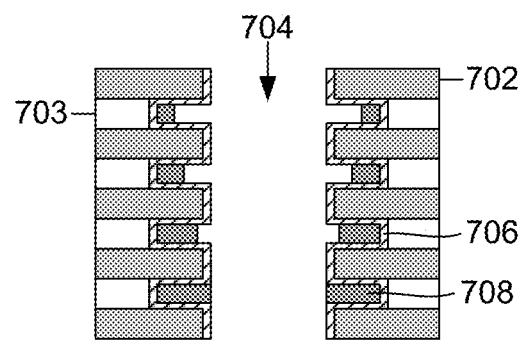
FIGS. 7L-7N illustrate etched features having different sidewall profiles according to certain embodiments.
Figure 7M:
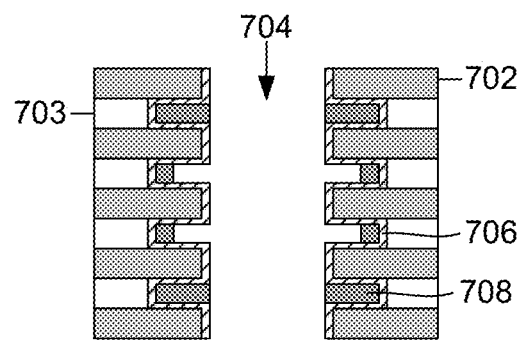
Figure 7N:
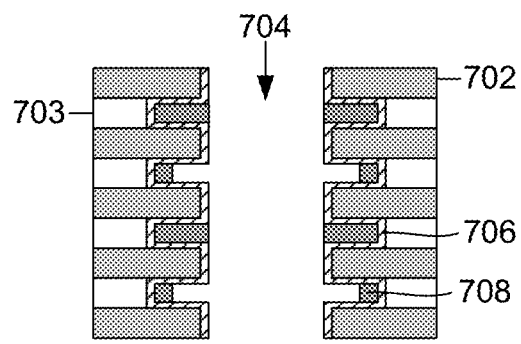

FIGS. 7L-7N depict alternate structures that can be achieved by controlling the duration of each etching operation. In FIG. 7L, the material 708 remaining within the cells after etching is more substantial near the bottom of feature 704 and less substantial near the top of the feature 704. In FIG. 7M, a substantial amount of material 708 remains after etching at both the top of the feature and the bottom of the sidewalls, while a lower amount of material 708 remains in a region near the middle of the sidewalls. In FIG. 7N, the material 708 remaining after etching alternates between a lower amount of material 708 remaining and a higher amount of material 708 remaining. Various other structures can be achieved as desired, simply by controlling the duration of each etching operation. This technique can be successful because each etching operation targets a particular vertical region along the sidewalls.

In a number of embodiments described herein, a method of laterally etching unwanted material from a sidewall of a feature on a substrate involves cycling an etching operation and a deposition operation. The etching operation laterally etches the unwanted material from a portion of the sidewall of the feature, and the deposition operation forms a protective film over a second portion of the sidewall of the feature. As the etching and deposition operations are cycled with one another, different iterations of the etching operation laterally etch the unwanted material from different portions of the sidewall of the feature, and different iterations of the deposition operation deposit the protective film over different second portions of the sidewall of the feature. In some cases, the different portions of the sidewall that are etched in different iterations of the etching operation may overlap with one another. Similarly, the different second portions of the sidewall on which the protective film is deposited in different iterations of the deposition operation may overlap with one another. In other words, while the different iterations of the etching operation and deposition operation target "different" portions of the sidewall, these portions may overlap. As an example, a first etching operation that etches the sidewall at a portion of the sidewall that is between about 70-90 kÅ deep and a second etching operation that etches the sidewall at a portion of the sidewall that is between about 60-80 kÅ deep are considered to etch over different portions of the sidewall, even though both etching operations target material at the 70-80 kÅ depth. Similarly, a first protective film deposited over the top 40% of a sidewall and a second protective film deposited over the top 60% of the sidewall are considered to be deposited over different second portions of the sidewall.

Etching Operation

As described in relation to FIGS. 2A and 2B, the lateral etching operation is performed at least twice, and may be cycled any number of times with the deposition and/or stripping operations, described further below. Each lateral etching operation targets a specific portion of the sidewalls of the high aspect ratio feature. In this way, the unwanted material is removed in a step-wise manner. In some cases, the material is removed from the top of the sidewalls to the bottom of the sidewalls, as described in relation to FIG. 2A. In other cases, the material is removed from the bottom of the sidewalls to the top of the sidewalls, as described in FIG. 2B. Some combination of these may also be used.

Figure 5:
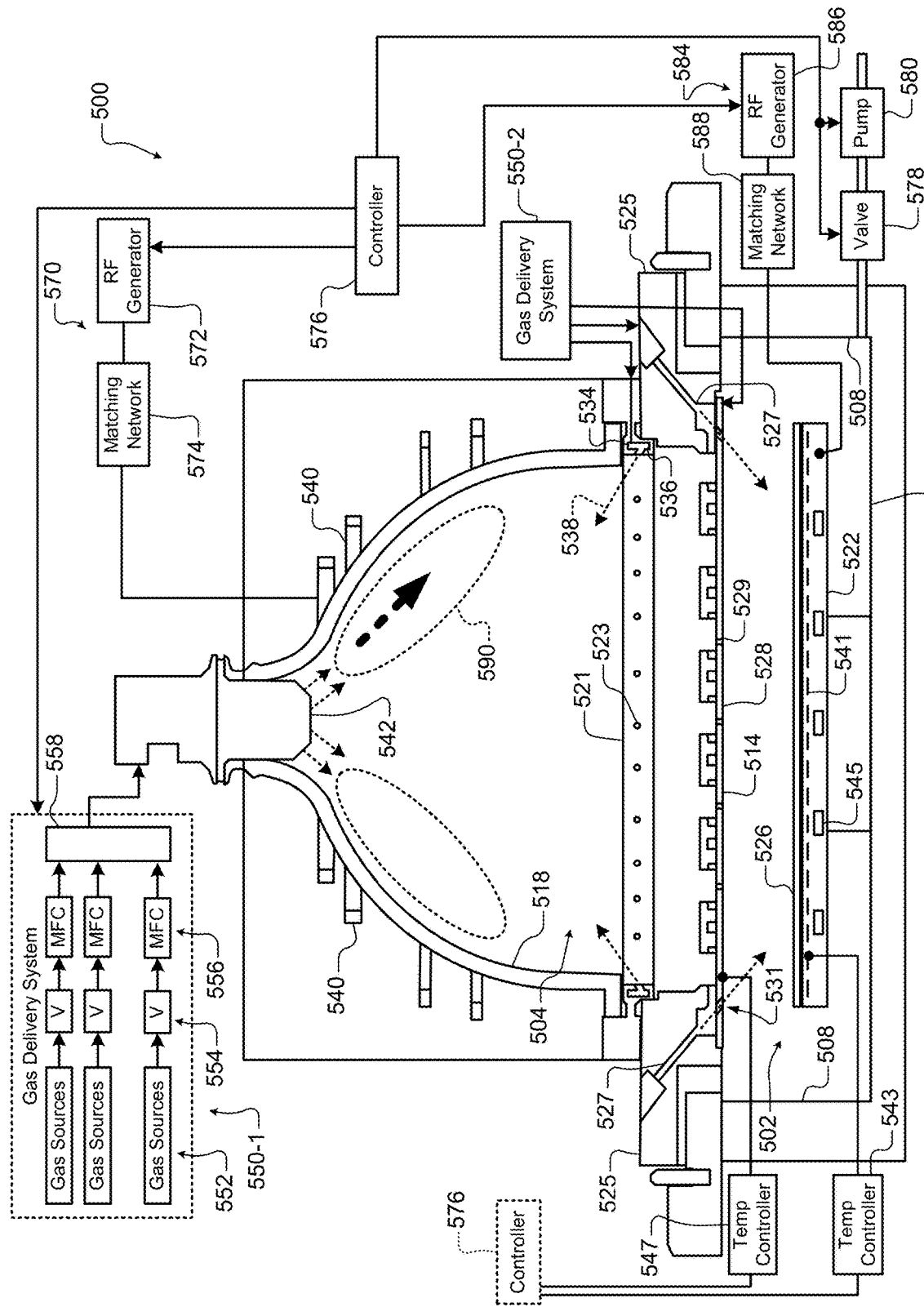
FIG. 5 is a functional block diagram showing an example apparatus that may be used to etch and deposit as described herein according to certain embodiments.

In various embodiments, the etching operation involves delivering an etching reactant, generating a plasma from the etching reactant, and exposing the substrate to the plasma (e.g., directly in the case of an in situ plasma, or indirectly in the case of a remote/upstream plasma) to laterally etch the sidewalls of a recessed high aspect ratio feature. The etching typically occurs in an isotropic manner. In a number of embodiments, the plasma is an inductively coupled plasma. The inductively coupled plasma may be generated upstream from the substrate in an upper chamber region, sometimes referred to as a plasma generation region. A gas distribution device, grid, or other structure may be positioned between the upper chamber region and a lower chamber region, where the substrate is positioned on a substrate support. The gas distribution device or other structure may act to control the composition/mix of species that filter through into the lower chamber region to interact with the substrate. Optionally, the gas distribution device may also be used to deliver gas to the lower and/or upper chamber region. In some cases, a capacitively coupled plasma may be provided as well. In some cases, the capacitively coupled plasma may be generated between the substrate support and the gas distribution device (or other structure) separating the substrate from the upper chamber region. The capacitively coupled plasma may be generated by applying a bias (e.g., an AC bias) on the substrate support, while the gas distribution device (or other structure) is grounded. An example apparatus is shown in FIG. 5, which is further discussed below.

Figure 6A:
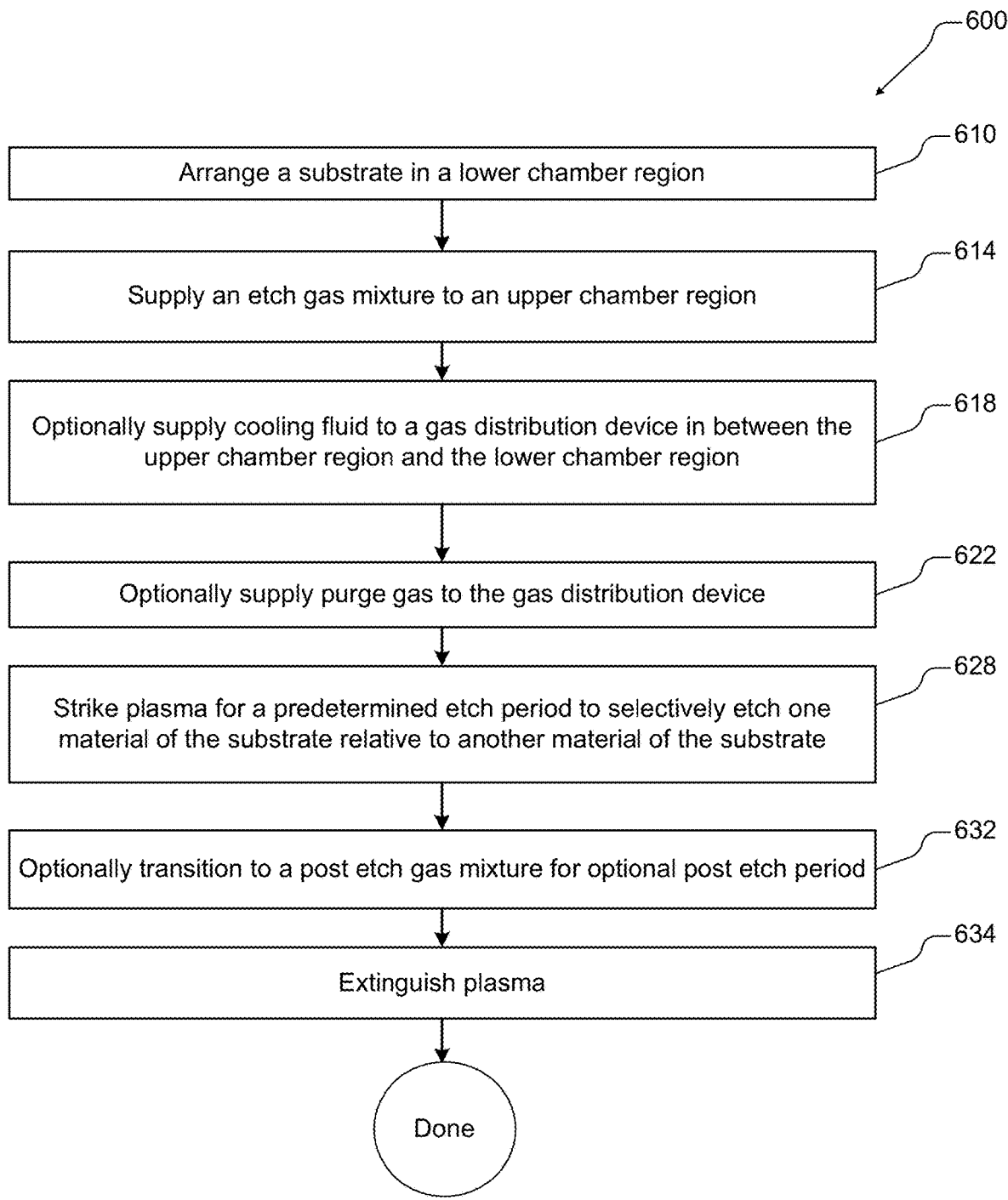
FIG. 6A is a flowchart describing a method of laterally etching the sidewalls of a recessed feature according to certain embodiments.

FIG. 6A is a flowchart describing a method 600 of laterally etching the sidewalls of a recessed high aspect ratio feature in a selective manner. At 610, a substrate is arranged in a lower chamber region of a substrate processing system. At 614, an etch gas mixture is supplied to an upper chamber region. At 618, cooling fluid is optionally supplied to a gas distribution device in between the upper chamber region and the lower chamber region. At 622, a purge gas is optionally supplied to the gas distribution device, which may deliver the purge gas to the lower chamber region. At 628, plasma is struck in the upper chamber region for a predetermined etch period to etch an unwanted material from the sidewalls of the substrate. The unwanted material is etched selectively with respect to an additional material that is exposed or becomes exposed during etching. With reference to FIGS. 1E and 1F, the etch is selective such that material 107 is targeted for removal, while liner 106 (if present) and/or first material 102 (if exposed) are substantially retained. At 632, the etch gas mixture may be transitioned to a post etch gas mixture for an optional post etch period. The post etch period may be provided to de-fluorinate the surfaces within the feature, and may be particularly useful during the final etching iteration. In a number of etching operations, one or more of operations 618, 622, and 632 may be omitted. At 634, the plasma is extinguished. This process etches the unwanted material from a particular portion of the sidewalls of the recessed high aspect ratio feature. The portion of the sidewalls that is targeted in each etching iteration is the portion directly below (e.g., deeper within the feature) the protective film (in iterations where the protective film is present during etching), or the top of the feature (in iterations where the protective film is not present during etching).

A number of different factors affect the etching results. Such factors include the pressure within the reaction chamber, the total flow of species into the reaction chamber and the composition of such species (including, e.g., the fluorine content of such species), the RF power level used to generate the inductively coupled plasma, and the RF power level used to generate the capacitively coupled plasma (if present). In certain embodiments, the pressure during etching may be between about 0.1-10 Torr. In some examples where the substrate has a diameter of about 300 mm, and the etchant is a halogen-containing species, the flow rate of the etchant may be between about 1-1000 sccm. The total flow rate of species into the reaction chamber (e.g., including etchants, inert species, and any other species) may be between about 50-5000 sccm. These flows are provided merely as examples, and may be adjusted for substrates and apparatuses of different sizes, and for etchants having a different fluorine content. In some implementations, the RF power used to generate the inductively coupled plasma may be between about 200-3000 W at a frequency of about 13.56 MHz. In cases where a capacitively coupled plasma is used in addition to the inductively coupled plasma, a bias applied to the substrate support to generate the capacitively coupled plasma may be between about 50-1000 W at a frequency of about 13.56 MHz. These power levels assume a single 300 mm diameter substrate is present in the chamber during etching, and can be scaled based on substrate surface area. Other power levels and frequencies can also be used. The substrate and/or substrate support may be maintained at a temperature between about −10 and 120° C., or below about 60° C. in some cases. In some cases, the duration of each etching iteration may be between about 10-100 seconds.

Example reactants that may be provided in the etch gas mixture include, but are not limited to, fluorine-based etchants (e.g., carbon tetrafluoride ($CF_4$), nitrogen trifluoride ($NF_3$), sulfur hexafluoride ($SF_6$), fluoromethane ($CH_3F$), difluoromethane ($CH_2F_2$), silicon tetrafluoride ($SiF_4$), hexafluorobutadiene ($C_4F_6$), hexafluoroethane ($C_2F_6$), etc.), oxygen-containing species (e.g., oxygen ($O_2$), nitrous oxide ($N_2O$), carbonyl sulfide (COS), carbon monoxide (CO), etc.), chlorine containing species (e.g., chlorine ($Cl_2$), boron trichloride ($BCl_3$), hydrogen chloride (HCl), etc.), sulfur-containing species (e.g., hydrogen sulfide ($H_2S$), carbonyl sulfide (COS), sulfur hexafluoride ($SF_6$), etc.), hydrocarbons (e.g., methane ($CH_4$), etc.), other hydrogen-based species (e.g., molecular hydrogen ($H_2$)), inert species (e.g., $N_2$, Ar, He, etc.), and combinations thereof. Particular examples are included below. In many cases, the etching chemistry produces fluorine radicals (F*) that act to remove the unwanted material from the sidewalls. In some cases, additional radicals (e.g., H* and N*) may also be produced.

In one example the unwanted material that is removed from the sidewalls is a metal such as tungsten. In this example, the etch gas mixture may include a fluorine-based reactant. The fluorine-based reactant may include carbon tetrafluoride ($CF_4$), nitrogen trifluoride ($NF_3$), sulfur hexafluoride ($SF_6$), fluoromethane ($CH_3F$), difluoromethane ($CH_2F_2$), fluoroform ($CHF_3$), hexafluorobutadiene ($C_4F_6$), etc. The etch gas mixture may further include molecular oxygen ($O_2$), molecular nitrogen ($N_2$), molecular chlorine ($Cl_2$), etc. In one embodiment, the etch gas mixture includes molecular hydrogen ($H_2$) and one or more gas selected from the group consisting of nitrogen trifluoride ($NF_3$), carbon tetrafluoride ($CF_4$), and sulfur hexafluoride ($SF_6$). In another embodiment, the etch gas mixture may include carbon monoxide (CO) and molecular nitrogen ($N_2$). In another embodiment, the gas mixture may include molecular nitrogen ($N_2$) and/or molecular oxygen ($O_2$), in addition to one or more gas selected from the group consisting of sulfur hexafluoride ($SF_6$), nitrogen trifluoride ($NF_3$), fluoromethane ($CH_3F$), difluoromethane ($CH_2F_2$) and tetrafluoromethane ($CF_4$). In another embodiment, the gas mixture may include molecular oxygen ($O_2$) and molecular chlorine ($Cl_2$). In another embodiment, the gas mixture may include molecular chlorine ($Cl_2$) and one or more reactants selected from the group consisting of sulfur hexafluoride ($SF_6$), nitrogen trifluoride ($NF_3$), fluoromethane ($CH_3F$), difluoromethane ($CH_2F_2$), and carbon tetrafluoride ($CF_4$). The substrate and/or substrate support may be maintained at a temperature between about 40-120° C. The pressure in the lower chamber region may be between about 0.05-10 Torr, for example between about 0.1-5 Torr. The metal may be removed at an etch rate of at least about 50 Å per minute in some cases. In some implementations, the selectivity of metal over another material (e.g., a nitride, oxide, other metal material) is greater than about 10:1 during removal of the metal layer, meaning that the metal is removed at a rate 10 times as fast as the nitride or oxide is removed. In some cases, the selectivity of metal over another material is greater than 200:1.

In a second example the unwanted material is silicon (e.g., polysilicon in some cases), and the etch gas mixture may include a fluorine-based species and a hydrogen-based species. The concentration of the hydrogen-based species may be greater than the concentration of the fluorine-based species. For example, the etch gas mixture may include the fluorine-based species at between about 0.7-10% by volume, and the hydrogen-based species at greater than about 50% by volume. The hydrogen-based species may include hydrogen ($H_2$) and/or ammonia ($NH_3$) in some cases. The fluorine-based species may include nitrogen trifluoride ($NF_3$), fluoroform ($CHF_3$), hexafluorobutadiene ($C_4F_6$), and/or carbon tetrafluoride ($CF_4$). The substrate and/or substrate support may be maintained at a temperature of about 60° C. or more, or in some cases between about 40-120° C. The pressure in the lower chamber region may be about 5 Torr or less (in some cases between about 0.1-5 Torr). The silicon may be removed at an etch rate of about 200 Å per minute in some cases. In some implementations, the etchant further includes a modifying gas species different from the fluorine-based species, where the modifying gas species includes at least one of nitrogen trifluoride ($NF_3$), carbon tetrafluoride ($CF_4$), fluoromethane ($CH_3F$), and sulfur hexafluoride ($SF_6$). In some implementations, the wafer is supported on an electrostatic chuck and further includes a native oxide layer, and the etching method further includes applying a bias to the substrate support (also referred to as an electrostatic chuck) to generate a capacitively-coupled plasma of at least a fluorine-based etchant in the lower chamber region, and exposing the substrate to the capacitively-coupled plasma to remove the native oxide layer, where removal of the native oxide layer is performed in situ with removal of the polysilicon layer. In some implementations, the selectivity of silicon over another material (e.g., a nitride or oxide material) is greater than about 500:1 during removal of the polysilicon layer, meaning that the silicon is removed at a rate 500 times as fast as the nitride or oxide is removed.

In a third example, the unwanted material is silicon nitride. Details provided above with respect to etching silicon may similarly be applied to etching silicon nitride. In some cases, however, the silicon nitride etch may occur at a substrate temperature that is between about −10 and 60° C. Example processing gases that may be used to etch silicon nitride include, e.g., nitrogen trifluoride ($NF_3$), carbon tetrafluoride ($CF_4$), sulfur hexafluoride ($SF_6$), helium (He), argon (Ar), molecular oxygen ($O_2$), nitrous oxide ($N_2O$), molecular nitrogen ($N_2$), and combinations thereof.

Example gases that may be provided in the purge gas include, but are not limited to, He, Ar, and $N_2$. Example gases that may be provided in the post etch gas mixture include, but are not limited to, hydrogen-containing species (e.g., $H_2$, $NH_3$, $CH_4$, $C_2H_4$, $C_3H_6$, $C_2H_6$, etc.), oxygen-containing species (e.g., $O_2$, $CO_2$, $N_2O$, $H_2O$, $O_3$, etc.), and combinations thereof.

The various factors described above that affect the etching operation may be uniform for the different etching iterations on a single substrate. In other cases, one or more of these factors may change between different etching iterations. For instance, the duration of each etching iteration can be selected to achieve uniform removal of the unwanted material along the entire length of the sidewalls. In some cases, the duration of the etching iterations may increase with additional iterations. In some other cases, the duration of the etching iterations may decrease with additional iterations. In other cases, the duration of the etching iterations may be uniform. In some embodiments, an etching iteration that targets unwanted material relatively closer to the top of the feature may be performed for a duration that is shorter than a different etching iteration that targets unwanted material relatively closer to the bottom of the feature. In some other embodiments, an etching iteration that targets unwanted material relatively closer to the top of the feature may be performed for a duration that is longer than a different etching iteration that targets unwanted material relatively closer to the bottom of the feature. In these or other cases, the temperature of the substrate and/or substrate support may increase or decrease with additional etching iterations. In these or other cases, the pressure in the reaction chamber (e.g., within an upper chamber region or a lower chamber region, if used) may increase or decrease with additional etching iterations. In these or other cases, the flow rate of etching reactants may increase or decrease with additional etching iterations. In these or other cases, the RF power used to generate the inductively coupled plasma may increase or decrease with additional etching iterations. In these or other cases, the RF power used to generate the capacitively coupled plasma (if present) may increase or decrease with additional etching iterations. In one example, one etching iteration may be done using only an inductively coupled plasma, and an earlier or later etching iteration may be done using both an inductively coupled plasma and a capacitively coupled plasma. These processing variables may be changed to target the etching at an appropriate region on the sidewalls of the substrate. However, it is understood that the presence/position of the protective film also plays a large role in determining where the etching is targeted.

Methods and apparatus for selective etching are further discussed in the following U.S. patent Applications, each of which is herein incorporated by reference in its entirety: U.S. patent application Ser. No. 14/938,635, filed Nov. 11, 2015, and titled "Ultrahigh Selective Polysilicon Etch with High Throughput"; U.S. patent application Ser. No. 15/271,381, filed Sep. 21, 2015, and titled "Systems and Methods for Ultrahigh Selective Nitride Etch"; U.S. patent application Ser. No. 15/014,539, filed Feb. 3, 2016, and titled "Systems and Methods for Selectively Etching Tungsten in a Downstream Reactor"; and U.S. patent application ser. No. 15/458,292, filed Mar. 14, 2017, and titled "Ultrahigh Selective Nitride Etch to Form FinFET Devices."

Deposition Operation

As described in relation to FIGS. 2A and 2B, the deposition operation is performed at least once, and may be cycled any number of times with the deposition and/or stripping operations. Each deposition operation deposits a protective film over a portion of the sidewalls of the recessed feature. The protective film forms on the sidewalls at the top of the feature, and extends down the sidewalls into the feature for some distance. This distance may change with additional iterations of the deposition operation. In other words, each protective film may be formed such that it reaches a particular depth, where this depth changes over the course of the overall etching method. In the method of FIG. 2A, the protective film may be deposited relatively shallow in earlier iterations, and deeper in later iterations, as shown in FIGS. 3A-3G. In the method of FIG. 2B, the protective film may be deposited relatively deep in earlier iterations, and shallower in later iterations, as shown in FIGS. 4A-4H. It is understood that there may be some departure from these general trends. The protective film is typically formed such that does not conformally coat the sidewalls of the feature. Instead, the protective film is non-conformal, having the greatest thickness near the top of the feature, and gradually thinning as it extends deeper into the feature.

In a number of embodiments, the deposition operation involves delivering one or more deposition reactants to form the protective film on the sidewalls of the feature. In various embodiments, the protective film is a polymeric film. The polymeric film may be a fluorocarbon-based film (e.g., a hydrofluorocarbon film). Fluorocarbon-based protective films are especially beneficial in cases where the etching chemistry is fluorine-based because such films are substantially resistant to this etching chemistry. Moreover, fluorocarbon-based polymeric films can be easily removed using the stripping method described below. In some cases, a fluorocarbon-based protective film may be deposited using $CH_xF_y$ chemistry, where x>y. Particular example reactants include $CH_4$ and $CH_3F$.

Other types of protective films may also be used. Such films may include oxide, silicon nitride, silicon, and hydrocarbon-based materials. In such cases, the reactants used to deposit the protective film may be chosen to achieve the desired composition.

Figure 6B:
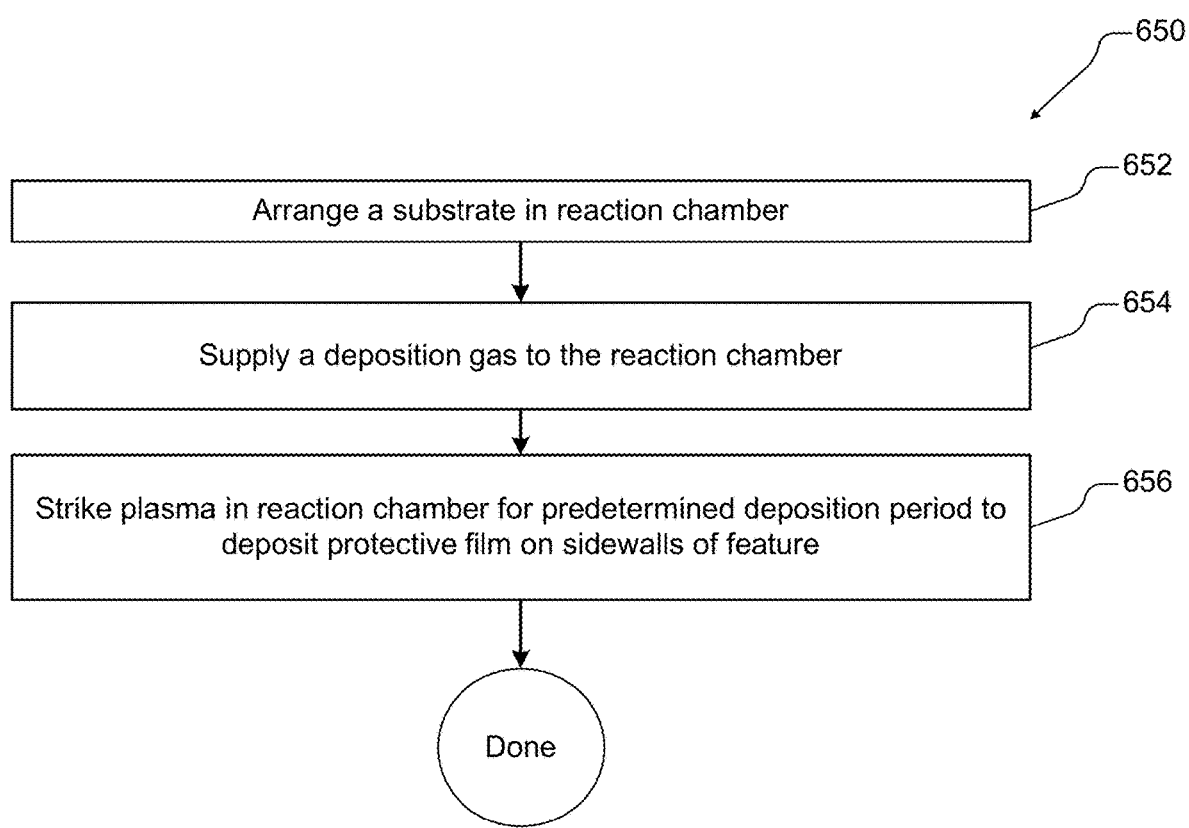
FIG. 6B is a flowchart describing a method of depositing a protective film on the sidewalls of a recessed feature according to certain embodiments.

FIG. 6B is a flowchart describing a method 650 of depositing a protective film on a portion of the sidewalls of a recessed feature. At 652, a substrate is arranged in a reaction chamber. The reaction chamber may be the same one used to laterally etch the sidewalls, or it may be a different reaction chamber, e.g., a reaction chamber specifically configured for deposition. In cases where two or more reaction chambers (e.g., a deposition chamber and an etching chamber) are used to perform the methods of FIG. 2A or 2B, the methods may further include transferring the substrate between the reaction chambers, as appropriate. In cases where the reaction chamber is as described in relation to FIG. 5, the substrate may be provided in the lower chamber region, arranged on the substrate support. At 654, a deposition gas is supplied to the reaction chamber. The deposition gas includes at least one deposition reactant, and may also include inert gas. In cases where the reaction chamber includes upper and lower chamber regions, as shown in FIG. 5, the deposition gas may be provided directly to the lower chamber region, the upper chamber region, or both. At 656, a plasma is struck in the reaction chamber for a deposition period. This results in deposition of the protective film on sidewalls of the feature. The plasma is a capacitively coupled plasma. In cases where the reaction chamber is as described in relation to FIG. 5, the capacitively coupled plasma may be generated in the lower chamber region, where the substrate is situated. Thus, the substrate is directly exposed to the capacitively coupled plasma. The plasma may be generated by applying a bias to the substrate holder while the gas distribution device (or grid or other structure) remains grounded. The bias may be an AC bias, which may act to pull positively charged ions toward the substrate during the negative half of the bias cycle.

In addition to the capacitively coupled plasma, an inductively coupled plasma may also be provided during deposition in some cases. For instance, the inductively coupled plasma may be generated in the upper chamber region, such that it is remote from the substrate. The inductively coupled plasma may be generated from an inert gas and/or a deposition reactant. In a number of cases, no inductively coupled plasma is used for depositing the protective film.

Depending on the composition of the protective film, a number of different deposition mechanisms may be used. In various cases, vapor deposition is used. In some implementations, the protective film may form through a chemical vapor deposition reaction, an atomic layer deposition reaction, a self-assembled monolayer reaction, etc.

A number of factors affect deposition of the protective film. In some cases, the temperature of the substrate and/or substrate support may be maintained between about 0-110° C., for example between about 40-90° C. during deposition. The pressure within the reaction chamber (or the region of the reaction chamber where the substrate is situated) may be between about 0.05-1 Torr, for example between about 0.1-0.5 Torr. The RF power used to generate the capacitively coupled plasma may be between about 50-1000 W, for example between about 100-500 W, at a frequency of about 13.56 MHz. The RF power used to generate the inductively coupled plasma, if present, may be between about 100-2000 W, for example between about 200-1000 W. Example flow rates for the deposition reactant may be between about 50-1000 sccm, for example between about 100-500 sccm. The total flow rate of species into the reaction chamber (e.g., including deposition reactants, inert species, and any other species) may be between about 50-4000 sccm, for example between about 100-1000 sccm. These flows may be adjusted for substrates and apparatuses of different sizes, and for different reactants.

These factors may be controlled and adjusted over the course of depositing different protective films (e.g., in different deposition iterations on a single substrate) in order to control the deposition depth of the protective film. In some cases, a first protective film may be formed at a first substrate temperature or substrate support temperature, and a second protective film may be formed at a later time on the same substrate at a higher or lower substrate temperature or substrate support temperature. In these or other cases, the first protective film may be formed at a first pressure, and the second protective film may be formed at a higher or lower pressure. In these or other cases, the first protective film may be formed at a first flow rate of deposition reactant, and the second protective film may be formed at a higher or lower flow rate of deposition reactant. In these or other cases, the first protective film may be formed while a first RF bias is applied to the substrate support to generate a capacitively coupled plasma, and the second protective film may be formed at a higher or lower RF bias level. In these or other cases, the first protective film may be formed while a first RF power is applied to coils to generate an inductively coupled plasma, and the second protective film may be formed at a higher or lower RF power level applied to the coils. These trends may be extended to additional protective films (e.g., using increasingly higher or lower values of processing conditions with each iteration of protective film formation). Generally speaking, factors that promote formation of the protective film relatively deeper in the feature include (1) lower temperature, (2) lower reactant flux, and (3) higher level of RF bias applied to the substrate support. By controlling these factors over the course of the various depositions, deposition of the protective film (and thus, removal of the unwanted material) can proceed as desired up or down the sidewalls, as shown in FIGS. 3A-3G and 4A-4H.

Stripping Operation

In a number of embodiments, the protective film is stripped away from the sidewalls at some point during the overall etching process. In some cases, the protective film may be cyclically removed and re-deposited, as described in relation to FIGS. 2B and 4A-4H. In still other cases, the stripping operation may be omitted. In some such cases, a final etching iteration may be sufficient to remove the protective film such that there is no reason to perform a separate stripping operation.

The stripping operation may involve exposing the substrate to plasma to thereby remove the protective film. In various embodiments, the plasma may be generated from molecular oxygen ($O_2$). Additional reactants and/or inert gas may also be provided. Oxygen-containing plasmas are particularly useful in cases where the protective film is a fluorocarbon film (e.g., a hydrofluorocarbon film), though they may be used to remove various other protective film compositions, as well.

In one example where the protective film is removed using plasma, the plasma may be an inductively coupled plasma and/or a capacitively coupled plasma. In cases where the apparatus used to process the substrate is similar to the one shown in FIG. 5, the inductively coupled plasma (if present) may be generated in the upper chamber region, and the capacitively coupled plasma (if present) may be generated in the lower chamber region. In other cases, an inductively coupled plasma and/or a capacitively coupled plasma may be formed in a reaction chamber that lacks separated upper and lower chamber regions. In cases where an inductively coupled plasma is used, the RF power used to generate the inductively coupled plasma may be between about 200-2000 W. In cases where a capacitively coupled plasma is used, the RF power used to generate the capacitively coupled plasma may be between about 50-500 W. These power levels assume a single 300 mm diameter substrate is present in the reaction chamber, and may be scaled for substrates of other sizes. The substrate and/or substrate temperature during stripping may be maintained between about −10 and 110° C. The pressure in the reaction chamber (e.g., in the lower chamber region, if present) during stripping may be between about 0.5-3 Torr. The flow rate of reactants may be between about 200-5000 sccm. The duration of each stripping operation may be between about 10-60 seconds.

Other processes may also be used to strip away the protective film. Such processes may utilize alternative oxygen-containing species (e.g., carbon dioxide ($CO_2$), nitrous oxide ($N_2O$), nitric oxide (NO)), and/or may dilute the oxygen-containing species using a diluent species (e.g., nitrogen ($N_2$), nitrous oxide ($N_2O$), argon (Ar), helium (He), elemental hydrogen ($H_2$), etc.).

In some embodiments, the stripping operation to remove the protective film may be performed in the same reaction chamber used to perform lateral etching of the sidewalls and deposition of the protective film. In this case, each of the methods of FIGS. 2A and 2B may be wholly performed in a single reaction chamber. In another embodiment, etching and deposition are performed in separate reaction chambers, and the stripping operation is performed in either the reaction chamber used to etch the substrate, or the reaction chamber used to deposit the protective film. In this case, each of the methods of FIGS. 2A and 2B may be performed using two different reaction chambers. In still another embodiment, etching, deposition, and stripping are all performed in separate reaction chambers. In this case, each of the methods of FIGS. 2A and 2B may be performed using three different reaction chambers. In cases where more than one reaction chamber is used to process a single substrate, the methods of FIGS. 2A and 2B may further include transferring the substrate among the different reaction chambers, as needed.

Apparatus

The methods described herein may be performed by any suitable apparatus. A suitable apparatus includes hardware for accomplishing the process operations and a system controller having instructions for controlling process operations in accordance with the present embodiments. For example, in some embodiments, the hardware may include one or more process stations included in a process tool.

Referring now to FIG. 5, an example of a substrate processing chamber 500 for selectively etching a first material with respect to a second material according to the present disclosure is shown. While a specific substrate processing chamber is shown and described, the methods described herein may be implemented on other types of substrate processing systems. In some examples, the substrate processing chamber 500 includes a remote (e.g., upstream from the substrate) inductively coupled plasma (ICP) source. An optional capacitively coupled plasma (CCP) source may be provided.

The substrate processing chamber 500 includes a lower chamber region 502 and an upper chamber region 504. The lower chamber region 502 is defined by chamber sidewall surfaces 508, a chamber bottom surface 510 and a lower surface of a gas distribution device 514. In some examples, the gas distribution device 514 is omitted.

The upper chamber region 504 is defined by an upper surface of the gas distribution device 514 and an inner surface of a upper chamber wall 518 (for example a dome-shaped chamber). In some examples, the upper chamber wall 518 rests on a first annular support 521. In some examples, the first annular support 521 includes one or more gas flow channels and/or holes 523 comprising a first inlet for delivering process gas to the upper chamber region 504, as will be described further below. The gas flow channels and/or holes 523 may be uniformly spaced around a periphery of the upper chamber region 504. In some examples, the process gas is delivered by the one or more gas flow channels and/or holes 523 in an upward direction at an acute angle relative to a plane including the gas distribution device 514, although other angles/directions may be used. In some examples, a plenum 534 in the first annular support 521 supplies gas to the one or more spaced gas flow channels and/or holes 523.

The first annular support 521 may rest on a second annular support 525 that defines one or more gas flow channels and/or holes 527 comprising a second inlet for delivering process gas to the lower chamber region 502. In some examples, holes 531 in the gas distribution device 514 align with the gas flow channels and/or holes 527. In other examples, the gas distribution device 514 has a smaller diameter and the holes 531 are not needed. In some examples, the process gas is delivered by the one or more spaced gas flow channels and/or holes 527 in a downward direction towards the substrate at an acute angle relative to the plane including the gas distribution device 514, although other angles/directions may be used.

In other examples, the upper chamber region 504 is cylindrical with a flat top surface and one or more flat inductive coils may be used. In still other examples, a single chamber may be used with a spacer located between a showerhead and the substrate support.

A substrate support 522 is arranged in the lower chamber region 502. In some examples, the substrate support 522 includes an electrostatic chuck (ESC), although other types of substrate supports can be used. A substrate 526 is arranged on an upper surface of the substrate support 522 during etching. In some examples, a temperature of the substrate 526 may be controlled by a heater plate 541, an optional cooling plate with fluid channels and one or more sensors (not shown); although any other suitable substrate support temperature control system may be used. In some examples, a temperature controller 543 may be used to control heating and cooling of the substrate support 522. Heating may be performed by the heater plate 541 and cooling may be performed by the cooling plate with fluid channels 545.

A temperature controller 547 may be used to control a temperature of the gas distribution device 514 by supplying heating/cooling fluid to a plenum in the gas distribution device 514. The temperature controllers 543 and/or 547 may further include a source of fluid, a pump, control valves and a temperature sensor (all not shown).

In some examples, the gas distribution device 514 includes a showerhead (for example, a plate 528 having a plurality of spaced holes 529). The plurality of spaced holes 529 extend from the upper surface of the plate 528 to the lower surface of the plate 528. In some examples, the spaced holes 529 have a diameter in a range from 0.1" to 0.75" and the showerhead is made of a conducting material such as aluminum or a non-conductive material such as ceramic with an embedded electrode made of a conducting material. In other examples described further below, smaller holes 529 can be used to increase the surface to volume ratio.

One or more inductive coils 540 are arranged around an outer portion of the upper chamber wall 518. When energized, the one or more inductive coils 540 create an electromagnetic field inside of the upper chamber wall 518. In some examples, an upper coil and a lower coil are used. A gas injector 542 injects one or more gas mixtures from a gas delivery system 550-1 into the upper chamber region 504.

In some examples, a gas delivery system 550-1 includes one or more gas sources 552, one or more valves 554, one or more mass flow controllers (MFCs) 556, and a mixing manifold 558, although other types of gas delivery systems may be used. A gas splitter (not shown) may be used to vary flow rates of a gas mixture. Another gas delivery system 550-2 may be used to supply an etch gas, tuning gas, purge gas or other gas mixtures to the gas flow channels and/or holes 523 and/or 527 (in addition to or instead of etch gas from the gas injector 542).

Suitable gas delivery systems are shown and described in commonly assigned U.S. patent application Ser. No. 14/945,680, entitled "Gas Delivery System" and filed on Dec. 4, 2015, which is hereby incorporated by reference in its entirety. Suitable single or dual gas injectors and other gas injection locations are shown and described in commonly assigned U.S. Provisional Patent Application Ser. No. 62/275,837, entitled "Substrate Processing System with Multiple Injection Points and Dual Injector" and filed on Jan. 7, 2016, which is hereby incorporated by reference in its entirety.

In some examples, the gas injector 542 includes a center injection location that directs gas in a downward direction and one or more side injection locations that inject gas at an angle with respect to the downward direction. In some examples, the gas delivery system 550-1 delivers a first portion of the gas mixture at a first flow rate to the center injection location and a second portion of the gas mixture at a second flow rate to the side injection location(s) of the gas injector 542. In other examples, different gas mixtures are delivered by the gas injector 542. In some examples, the gas delivery system 550-2 delivers tuning gas to the gas flow channels and/or holes 523 and 527 and/or to other locations in the processing chamber as will be described below. For example, the gas delivery system 550-2 can also deliver gas to a plenum in the gas distribution device 514.

A plasma generator 570 may be used to generate RF power that is output to the one or more inductive coils 540. Plasma 590 is generated in the upper chamber region 504. In some examples, the plasma generator 570 includes an RF generator 572 and a matching network 574. The matching network 574 matches an impedance of the RF generator 572 to the impedance of the one or more inductive coils 540. In some examples, the gas distribution device 514 is connected to a reference potential such as ground. A valve 578 and a pump 580 may be used to control pressure inside of the lower and upper chamber regions 502, 504 and to evacuate reactants.

A controller 576 communicates with the gas delivery systems 550-1 and 550-2, the valve 578, the pump 580, and/or the plasma generator 570 to control flow of process gas, purge gas, tuning gas, RF plasma and chamber pressure. In some examples, plasma is sustained inside the upper chamber wall 518 by the one or more inductive coils 540. One or more gas mixtures are introduced from a top portion of the chamber using the gas injector 542 (and/or gas flow channels and/or holes 523) and plasma is confined within the upper chamber wall 518 using the gas distribution device 514.

Confining the plasma in the upper chamber wall 518 allows volume recombination of plasma species and effusing desired etchant species through the gas distribution device 514. In some examples, there is no RF bias applied to the substrate 526. As a result, there is no active sheath on the substrate 526 and ions are not hitting the substrate with any finite energy. Some amount of ions will diffuse out of the plasma region through the gas distribution device 514. However, the amount of plasma that diffuses is an order of magnitude lower than the plasma located inside the upper chamber wall 518. Most of ions in the plasma are lost by volume recombination at high pressures. Surface recombination loss at the upper surface of the gas distribution device 514 also lowers ion density below the gas distribution device 514.

In some examples, an RF bias generator 584 is provided and includes an RF generator 586 and a matching network 588. The RF bias can be used to create plasma between the gas distribution device 514 and the substrate support or to create a self-bias on the substrate 526 to attract ions. The controller 576 may be used to control the RF bias.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed. Certain references have been incorporated by reference herein. It is understood that any disclaimers or disavowals made in such references do not necessarily apply to the embodiments described herein. Similarly, any features described as necessary in such references may be omitted in the embodiments herein.

The subject matter of the present disclosure includes all novel and nonobvious combinations and sub-combinations of the various processes, systems and configurations, and other features, functions, acts, and/or properties disclosed herein, as well as any and all equivalents thereof.

What is claimed is:

1. An apparatus for laterally etching unwanted material from a sidewall of feature on a substrate, the apparatus comprising:
   a reaction chamber comprising a lower chamber region and an upper chamber region;
   a gas distribution device separating the lower chamber region from the upper chamber region;
   an inductively coupled plasma source that generates an inductively coupled plasma in the upper chamber region;
   a capacitively coupled plasma source that generates a capacitively coupled plasma in the lower chamber region;
   a first inlet for delivering gas phase reactants to the upper chamber region;
   a second inlet for delivering gas phase reactants to the lower chamber region;
   and
   a controller configured with instructions to be executed by one or more processors to perform:
   (a) an etching operation by generating an inductively coupled etching plasma comprising an etching reactant in the upper chamber region while the substrate is positioned in the lower chamber region, wherein the etching operation laterally etches the unwanted material from a portion of the sidewall of the feature;
   (b) a deposition operation by generating a capacitively coupled deposition plasma comprising a deposition reactant in the lower chamber region while the substrate is positioned in the lower chamber region, wherein the deposition operation forms a protective film over a second portion of the sidewall of the feature, wherein the protective film is non-conformal such that it is thickest near a top of the sidewall and does not extend all the way to a bottom of the sidewall; and
   (c) cycling the etching operation of (a) and the deposition operation of (b) until the unwanted material is laterally etched along the entire sidewall of the feature, wherein different iterations of (a) laterally etch the unwanted material from different portions of the sidewall of the feature, wherein different iterations of (b) deposit the protective film over different second portions of the sidewall of the feature, and wherein during at least one iteration of the etching operation in (a), the portion of the sidewall that is laterally etched is directly below the second portion of the sidewall that is covered by the protective film deposited in a previous iteration of (b).

2. The apparatus of claim 1, wherein the controller is configured with instructions to be executed by one or more processors to perform a first iteration of (a) before performing a first iteration of (b), such that the first iteration of (a) is performed without the protective film on the sidewall, wherein the portion of the sidewall that is laterally etched in the first iteration of (a) is a top portion of the sidewall.

3. The apparatus of claim 2, wherein the controller is configured with instructions to be executed by one or more processors to perform the first iteration of (b) such that the protective film forms on the same portion of the sidewall that was laterally etched in the first iteration of (a).

4. The apparatus of claim 3, wherein the controller is configured with instructions to be executed by one or more processors to perform a second iteration of (a) after the first iteration of (b), such that the portion of the sidewall that is laterally etched in the second iteration of (a) is deeper in the feature compared to the portion of the sidewall that is laterally etched in the first iteration of (a).

5. The apparatus of claim 2, wherein the controller is configured with instructions to be executed by one or more processors to perform forming the protective film in each iteration of (b) over the portion of the sidewall at which the unwanted material is removed in an immediately previous iteration of (a), such that the protective film always forms in (b) to cover the portion of the sidewall that was just etched in the previous iteration of (a).

6. The apparatus of claim 2, wherein the controller is configured with instructions to be executed by one or more processors to perform removing the unwanted material from the top of the sidewall to the bottom of the sidewall, in that order, as additional iterations of (a) and (b) are performed.

7. The apparatus of claim 6, wherein the controller is configured with instructions to be executed by one or more processors to perform forming the protective film such that it reaches increasingly greater depths along the sidewall as additional iterations of (b) are performed.

8. The apparatus of claim 7, wherein the controller is configured with instructions to be executed by one or more processors to perform forming the protective film using different sets of deposition conditions in different iterations of (b).

9. The apparatus of claim 8, wherein the different sets of deposition conditions in the different iterations of (b) vary from one another with respect to at least one variable selected from the group consisting of: substrate support temperature, pressure, flow rate of the deposition reactant, and RF power used to generate the capacitively coupled plasma.

10. The apparatus of claim 1, wherein the controller is configured with instructions to be executed by one or more processors to perform a first iteration of (b) before a first iteration of (a) such that the first iteration of (a) is performed while the protective film is present on the sidewall.

11. The apparatus of claim 10, wherein the controller is configured with instructions to be executed by one or more processors to perform removing the unwanted material from the bottom of the sidewall to the top of the sidewall, in that order, as additional iterations of (a) and (b) are performed.

12. The apparatus of claim 11, wherein the controller is configured with instructions to be executed by one or more processors to perform forming the protective film such that it reaches increasingly shallow depths along the sidewall as additional iterations of (b) are performed.

13. The apparatus of claim 11, wherein the controller is further configured withinstructionstobeexecutedbyoneor-moreprocessorstoDerformstripping the protective film from the sidewall after each iteration of (a) and prior to a subsequent iteration of (b), wherein stripping the protective film comprises exposing the substrate to a stripping plasma comprising oxygen.

14. The apparatus of claim 1, wherein the controller is configured with instructions to be executed by one or more processors to perform forming the protective film such that it is a hydrofluorocarbon-based polymeric film.

15. The apparatus of claim 14, wherein the controller is configured with instructions to be executed by one or more processors to perform providing an etching reactant that produces fluorine radicals.

16. The apparatus of claim 1, wherein the controller is configured with instructions to be executed by one or more processors to perform removing metal from the sidewalls, the unwanted material comprising the metal.

17. The apparatus of claim 1, wherein the controller is configured with instructions to be executed by one or more processors to perform removing polysilicon from the sidewalls, the unwanted material comprising the polysilicon.

18. The apparatus of claim 1, wherein the controller is configured with instructions to be executed by one or more processors to perform removing silicon nitride from the sidewalls, the unwanted material comprising the silicon nitride.

* * * * *